(12) United States Patent
Strohmann et al.

(10) Patent No.: US 12,718,614 B2
(45) Date of Patent: Aug. 25, 2026

(54) ACOUSTIC SENSOR SYSTEMS WITH DIFFERENT HEIGHTS

(71) Applicant: QUALCOMM Incorporated, San Diego, CA (US)

(72) Inventors: Jessica Liu Strohmann, Cupertino, CA (US); Hung-Jen Wang, New Taipei City (TW); Jae Hyeong Seo, Pleasanton, CA (US); Wei-Hsiang Weng, Hsin-Chu (TW); Shiang-Chi Lin, Taoyuan (TW)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/812,851

(22) Filed: Aug. 22, 2024

(65) Prior Publication Data

US 2026/0057695 A1 Feb. 26, 2026

(51) Int. Cl.
*G06V 40/13* (2022.01)
*H10N 30/87* (2023.01)

(52) U.S. Cl.
CPC ....... *G06V 40/1306* (2022.01); *H10N 30/872* (2023.02)

(58) Field of Classification Search
None
See application file for complete search history.

(56) References Cited

U.S. PATENT DOCUMENTS

| | | | | |
|---|---|---|---|---|
| 2002/0007118 | A1 | 1/2002 | Adachi et al. | |
| 2017/0323130 | A1* | 11/2017 | Dickinson .......... | G06V 40/1306 |
| 2019/0343492 | A1* | 11/2019 | Miyazawa ........... | A61B 8/4427 |
| 2020/0160018 | A1* | 5/2020 | Panchawagh ........ | H10N 30/857 |
| 2020/0393921 | A1* | 12/2020 | Moon ................ | G06V 40/1306 |
| 2021/0019018 | A1 | 1/2021 | Guo et al. | |
| 2022/0102618 | A1 | 3/2022 | Giusti et al. | |

OTHER PUBLICATIONS

Co-pending U.S. Appl. No. 18/812,835, filed Aug. 22, 2024.
International Search Report and Written Opinion—PCT/US2025/042291—ISA/EPO—Dec. 8, 2025.

* cited by examiner

*Primary Examiner* — Joseph R Haley
(74) *Attorney, Agent, or Firm* — QUALCOMM Incorporated

(57) ABSTRACT

Acoustic sensor systems with different heights, as well as methods for configuring and operating such sensor systems are disclosed. In some embodiments, a sensor system described herein may include an acoustic receiver element; and an acoustic transmitter element; wherein the first portion of the piezoelectric material of the acoustic receiver element comprises a first thickness, and the second portion of the piezoelectric material of the acoustic transmitter element comprises a second thickness different from the first thickness; and wherein the isolation layer is structured to create a gap that physically separates the first portion of the second electrode layer from the second portion of the second electrode layer.

18 Claims, 19 Drawing Sheets

Figure 3

ACOUSTIC SENSOR SYSTEMS WITH DIFFERENT HEIGHTS

TECHNICAL FIELD

This disclosure relates generally to devices and systems using acoustic sensors.

DESCRIPTION OF RELATED TECHNOLOGY

A variety of different sensing technologies and algorithms are being implemented in devices. Sensing technology is ubiquitous in devices and can be used in various ways, such as identity and fingerprint detection, and biometric and biomedical applications, including health and wellness monitoring. Some such sensing technologies are, or include, acoustic sensors including ultrasonic sensors. This push is partly a result of performance limitations in traditional sensing used with devices. Although some previously deployed devices can provide acceptable results, improved detection devices and systems would be desirable.

SUMMARY

The systems, methods and devices of this disclosure each have several aspects, no single one of which is solely responsible for the desirable attributes disclosed herein.

In one aspect of the present disclosure, a sensor system is disclosed. In some embodiments, the sensor system may include: an acoustic receiver element having: a first electrode layer; a first planarization layer disposed on the first electrode layer; a first portion of a second electrode layer disposed on the first planarization layer; a first portion of an isolation layer disposed on the first portion of the second electrode layer; and a first portion of a piezoelectric material disposed on the first portion of the isolation layer; and an acoustic transmitter element having: a second portion of the second electrode layer; a second portion of the isolation layer disposed on the second portion of the second electrode layer; and a second portion of the piezoelectric material disposed on the second portion of the isolation layer.

In some implementations, the first portion of the piezoelectric material of the acoustic receiver element may have a first thickness, and the second portion of the piezoelectric material of the acoustic transmitter element may have a second thickness different from the first thickness. In some implementations, the isolation layer may be structured to create a gap that physically separates the first portion of the second electrode layer from the second portion of the second electrode layer.

In some embodiments, the sensor system may include: an acoustic receiver element having: a first portion of a first electrode layer; a first planarization layer disposed on the first portion of the first electrode layer; a first portion of a second electrode layer disposed on the first planarization layer; an isolation layer disposed on the first portion of the second electrode layer; and a first portion of a piezoelectric material disposed at least on the isolation layer; and an acoustic transmitter element having: a second portion of the first electrode layer; a second portion of the second electrode layer disposed on the second portion of the first electrode layer; and a second portion of the piezoelectric material disposed on the second portion of the second electrode layer.

In some implementations, the first portion of the piezoelectric material of the acoustic receiver element may have a first thickness, and the second portion of the piezoelectric material of the acoustic transmitter element may have a second thickness different from the first thickness.

In another aspect of the present disclosure, an apparatus is disclosed. In some embodiments, the apparatus may include: an acoustic receiver element having: a first electrode layer; a first portion of a second electrode layer; a first portion of an isolation layer disposed on the first portion of the second electrode layer; and a first portion of a piezoelectric material disposed on the first portion of the isolation layer; and an acoustic transmitter element comprising: a second portion of the second electrode layer; a second portion of the isolation layer disposed on the second portion of the second electrode layer; and a second portion of the piezoelectric material disposed on the second portion of the isolation layer.

In some implementations, the first portion of the piezoelectric material of the acoustic receiver element may have a first thickness, and the second portion of the piezoelectric material of the acoustic transmitter element may have a second thickness different from the first thickness. In some implementations, the isolation layer may be structured to create a gap that physically separates the first portion of the second electrode layer from the second portion of the second electrode layer.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIG. 3 shows a block diagram that shows example components of a display apparatus.

Like reference numbers and designations in the various drawings indicate like elements.

DETAILED DESCRIPTION

Figure 1A:
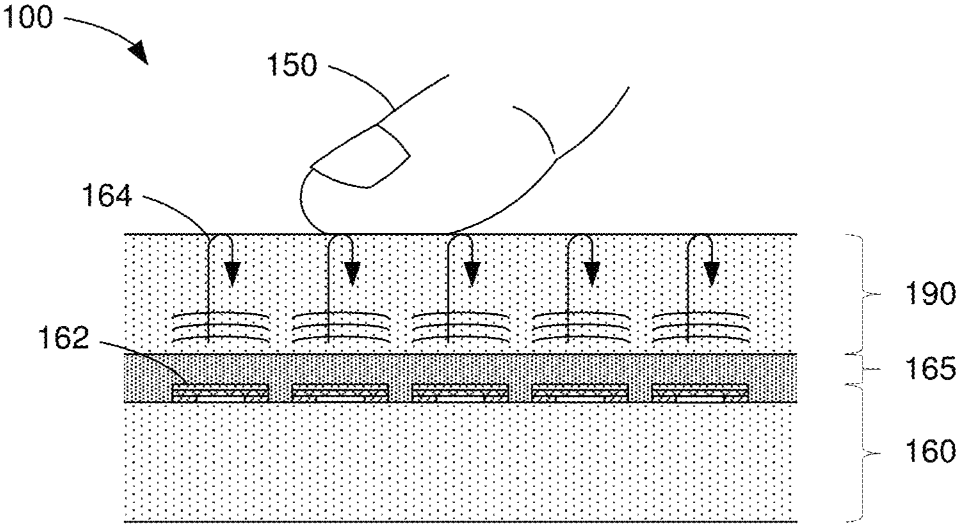
FIG. 1A shows a side view of an example configuration of an ultrasonic sensor array capable of ultrasonic imaging.

The following description is directed to certain implementations for the purposes of describing various aspects of this disclosure. However, a person having ordinary skill in the art will readily recognize that the teachings herein can be applied in a multitude of different ways. Some of the concepts and examples provided in this disclosure are especially applicable to user sensing applications. For example, fingerprint detection can be performed using the disclosed embodiments. However, some implementations also may be applicable to other types of sensing applications including biometric sensing, as well as to various other systems. The described implementations may be implemented in any device, apparatus, or system that includes an apparatus as disclosed herein. In addition, it is contemplated that the described implementations may be included in or associated with a variety of electronic devices (which may also be referred to herein simply as "devices" or a "device") such as, but not limited to, mobile telephones, multimedia Internet-enabled cellular telephones, mobile television receivers, wireless devices, smartphones, smart cards, tablets, wearable devices such as bracelets, armbands, wristbands, watches, smartwatches, rings, headbands, patches, chest bands, anklets, etc., Bluetooth® devices, personal data assistants (PDAs), wireless electronic mail receivers, handheld or portable computers, netbooks, notebooks, smartbooks, printers, copiers, scanners, facsimile devices, global positioning system (GPS) receivers or navigators, cameras, digital media players, game consoles, wrist watches, clocks, calculators, television monitors, flat panel displays, electronic reading devices (e.g., e-readers), mobile health devices, computer monitors, auto displays (including odometer and speedometer displays, dashboard displays, etc.), cockpit controls and/or displays, camera view displays (such as the display of a rear view camera in a vehicle), architectural structures, microwaves, refrigerators, stereo systems, cassette recorders or players, DVD players, CD players, VCRs, radios, portable memory chips, washers, dryers, washer/dryers, parking meters, automobile doors, Internet of Things (IoT) devices, palm scanners, or point-of-sale (POS) terminals. Thus, the teachings are not intended to be limited to the specific implementations depicted and described with reference to the drawings; rather, the teachings have wide applicability as will be readily apparent to persons having ordinary skill in the art.

Modern devices include various functionalities and hardware that support the functionalities. As but one example, fingerprint sensing using a sensor is one such function of a device.

As an aside, toe prints can be used to identify users because they are unique and permanent, similar to fingerprints. Toe prints have ridge (raised portions) patterns and furrows (recessed portions, otherwise known as valleys) similar to fingerprints. Similar to fingerprints, toe prints have unique features referred to as minutiae points that can differentiate one person from another. The whorls, ridges, valleys, and furrows in toc prints develop uniquely in each person. Therefore, the embodiments described herein can be used with toes for equal effectiveness as with fingers. Palms and feet may also be used for identification using unique features. However, toes, palms and feet are used less often for identification, particularly with aforementioned types of devices. For simplicity, "fingerprint" in the context of the present disclosure may refer to fingerprints, toe prints, palm prints, or footprints, and "finger" may refer to fingers, toes, palms, or feet.

Fingerprint data obtained using a fingerprint sensor may be used by the device to identify an object (such as a finger or fingerprint), change an operative state of the device, and/or activate other functions of the device (unlock or lock the device, initialize an application, authenticate a user, etc.). In some embodiments, acoustic imaging, e.g., via transmission and receipt of ultrasonic signals by a transmitter and a receiver of the fingerprint sensor, may be used to obtain the fingerprint data.

Particularly with user devices such as mobile devices, fingerprint sensing can be used by software and applications (apps) usable on the device to authenticate a user, e.g., to log into the user's account without entering a password. Some devices may be configured such that the sensor (such as a fingerprint sensor) is disposed beneath a display, which in cases of many smart devices (smartphone, tablets, etc.) may be a screen or other user interface.

Fingerprint sensors are thus useful for various purposes and are available in various types of devices and displays. However, there are performance limitations when it comes to certain displays. As one example, foldable displays do not have the level of fingerprint sensor or fingerprint sensor system performance that can be seen in flat-panel displays. As another example, displays with a thicker polarizer layer (e.g., about 100 μm) may also suffer from performance limitations. As consumer devices and display technologies continue to mature, improving the performance of sensors can improve user experience and allow the sensors to accommodate devices.

In some embodiments described in the present disclosure, an acoustic (e.g., ultrasonic) fingerprint sensor system may include transmitter elements, receiver elements, or both that have differing heights. Various arrangements and configurations of layers of materials may be formed, with transmitter elements and receiver elements having respective stacks of layers so as to create the height difference. The heights and height differences may be adjustable depending on desired performance tradeoffs for the transmitter elements and receiver elements, as the heights and relative heights can influence the respective performances. In some configurations, an electrical separation between the transmitter elements and the receiver elements may be placed to isolate them. The transmitter elements and the receiver elements may operate as independent pixels. The sensor system may operate in different modes, by applying voltages to or grounding different electrodes of the transmitter elements and opening electrode(s) of the receiver elements in a signal transmitting mode, or by grounding the electrodes of the transmitter elements and opening electrode(s) of the receiver elements in a signal receiving mode.

In some example implementations, a time delay may be added to different pixels (e.g., transmitter and/or receiver elements) to induce a lens effect, which may enable a stronger acoustic signal to be transmitted, which may be advantageous in implementations where the performance of the transmitter elements is relatively lower than that of the receiver elements.

In some example implementations, some returning acoustic (e.g., ultrasonic) signals may be separated, filtered out, removed, or otherwise disregarded based on a phase difference. Such filtering out may be useful for anti-spoofing purposes, where, e.g., a real finger may be differentiated from a spoofed object.

Particular implementations of the subject matter described in this disclosure can be implemented to realize one or more of the following potential advantages. The height difference in sensor elements (e.g., difference between the height of transmitter elements and the height of receiver elements) may open up design options for certain display devices (e.g., foldable displays) while maintaining at least similar fingerprint sensor system performance as traditional sensors. The implementations discussed herein may also allow for tuning of relative performances in designs that emphasize either transmitter or receiver performance. Thus, the present disclosure enables flexibility in implementation of acoustic (e.g., ultrasonic) sensor systems and apparatus. The implementations discussed herein may also be used for various useful applications, such as improving the security associated with fingerprint sensing by anti-spoofing, or enhancing signals from an array of transmitter elements.

Additional details will follow after an initial description of relevant systems and technologies.

FIG. 1A illustrates a side view of an example configuration of an ultrasonic sensor array of sensor elements which is capable of ultrasonic imaging. FIG. 1A depicts an ultrasonic sensor array 100 with an array of sensor elements configured as transmitting and receiving elements that may be used for ultrasonic imaging. In some implementations, the ultrasonic sensor array 100 may be an example of or a portion of a sensor element or a sensor as discussed herein.

Sensor elements 162 on a sensor array substrate 160 may emit and detect ultrasonic waves. As illustrated, an ultrasonic wave 164 may be transmitted from at one or more sensor elements 162. The ultrasonic wave 164 may travel through a propagation medium such as an acoustic coupling medium 165 and a platen 190 towards an object 150 such as a finger or a stylus positioned on an outer surface of the platen 190. A portion of the ultrasonic wave 164 may be transmitted through the platen 190 and into the object 150, while a second portion is reflected from the surface of platen 190 back towards a sensor element 162. The amplitude of the reflected wave may depend in part on the acoustic properties of the object 150 and the platen 190. The reflected wave may be detected by the sensor elements 162, from which an image of the object 150 may be acquired. For example, with sensor arrays having a pitch of about 50 microns (about 500 pixels per inch), ridges and valleys of a fingerprint may be detected. An acoustic coupling medium 165, such as an adhesive, gel, a compliant layer or other acoustic coupling material may be provided to improve coupling between an array of sensor elements 162 disposed on the sensor array substrate 160 and the platen 190. The acoustic coupling medium 165 may aid in the transmission of ultrasonic waves to and from the sensor elements 162. The platen 190 may include, for example, a layer of glass, plastic, sapphire, metal, metal alloy, or other platen material. An acoustic impedance matching layer (not shown) may be disposed on an outer surface of the platen 190. The platen 190 may include a coating (not shown) on the outer surface. In some implementations, sensor elements may be co-fabricated with thin-film transistor (TFT) circuitry or CMOS circuitry on or in the same substrate, which may be a silicon, silicon on insulator (SOI), glass or plastic substrate, in some examples. The TFT, silicon or semiconductor substrate may include row and column addressing electronics, multiplexers, local amplification stages and control circuitry.

Figure 1B:
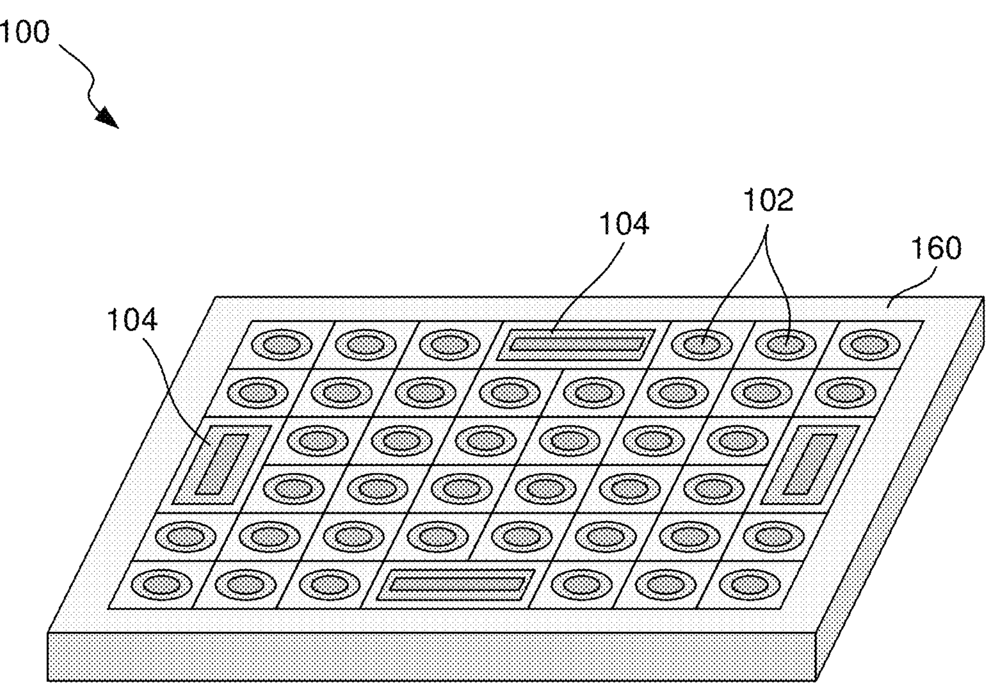
FIG. 1B shows an example configuration of ultrasonic sensor array.

FIG. 1B shows an example configuration of an ultrasonic sensor array including sensor elements 102 and sensor elements 104 formed on a substrate 160. Substrate 160 may be an example of the sensor array substrate 160 mentioned above. The sensor elements 102 are shown as circular sensor elements. In some implementations, the sensor elements 102 are not used for force detection in the non-ultrasonic force detection mode. Sensor elements 104 are larger than the sensor elements 102 and are shown as rectangular. It will be understood that these sensor elements 102, 104 may be any appropriate shape and size. In some implementations, the sensor elements 104 that are used for non-ultrasonic force detection may be larger than the sensor elements 102 that are used solely for ultrasonic imaging. The sensor elements 104, used during non-ultrasonic force detection mode to detect applied force as described above, are located on the periphery of the ultrasonic sensor array 100. By placing the sensor elements 104 used for force detection around the periphery, the ultrasonic sensor array may be used for centering detection. While only the sensor elements 104 are used for non-ultrasonic force detection, both sensor elements 102 and sensor elements 104 may be used for ultrasonic imaging as described above with respect to FIG. 1A. That is, the sensor elements 104 may initially be used to statically detect force from a finger press and then be switched to an ultrasonic mode for ultrasonic imaging in some implementations. In alternative implementations, the sensor elements 104 may be used only for force detection, with only the sensor elements 102 used for ultrasonic imaging. In some implementations, sensor elements 104 near the periphery of the ultrasonic sensor array 100 may be used for cursor, pointer or icon control, or for screen navigation on a display of a mobile device. In some implementations, some or all of sensor elements 102, 104, 162 in FIGS. 1A and 1B may be piezoelectric micromachined ultrasonic transducers (PMUT) and/or capacitive micromachined ultrasonic transducers (CMUT) sensor elements.

Figure 2A:
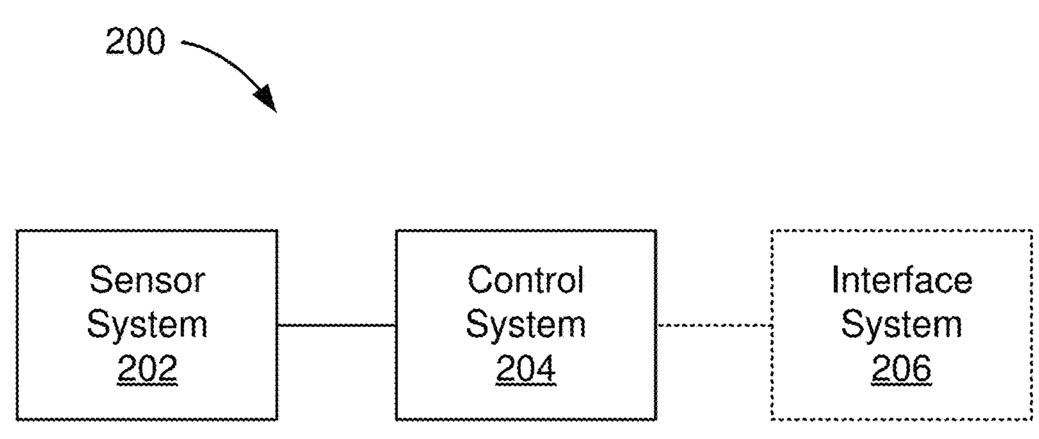
FIG. 2A shows a block diagram representation of components of an example sensing system.

An ultrasonic sensor array may be part of a sensing system of a device, for example, a mobile device. FIG. 2A shows a block diagram representation of components of an example sensing system 200. As shown, the sensing system 200 may include a sensor system 202 and a control system 204 that may, in some implementations, be electrically and/or communicatively coupled to the sensor system 202. In some implementations, control system 204 may include one or more controllers or processors. In some configurations, the control system 204 may be part of the device having the sensing system. In some configurations, the control system 204 may be part of the sensing system. In some configurations, the control system 204 may be external to the device having the sensing system, for example but not limited to, on a server (cloud), remote storage, or another device other than the device having the sensing system. In some configurations, the one or more controllers or processors may be distributed across two or more devices including external apparatus.

The sensor system 202 (e.g., in conjunction with control system 204, in some implementations) may be capable of detecting the presence of an object, for example a human finger. The sensor system 202 may be capable of scanning an object and providing raw measured image information usable to obtain an object signature, for example, a fingerprint of a human finger (such as 150). The control system 204 may be capable of controlling the sensor system 202 and processing the raw measured image information received from the sensor system. In some implementations, the sensing system 200 may include an interface system 206 capable of transmitting or receiving data, such as raw or processed measured image information, to or from various components within or integrated with the sensing system 200 or, in some implementations, to or from various components, devices or other systems external to the sensing system.

Figure 2B:
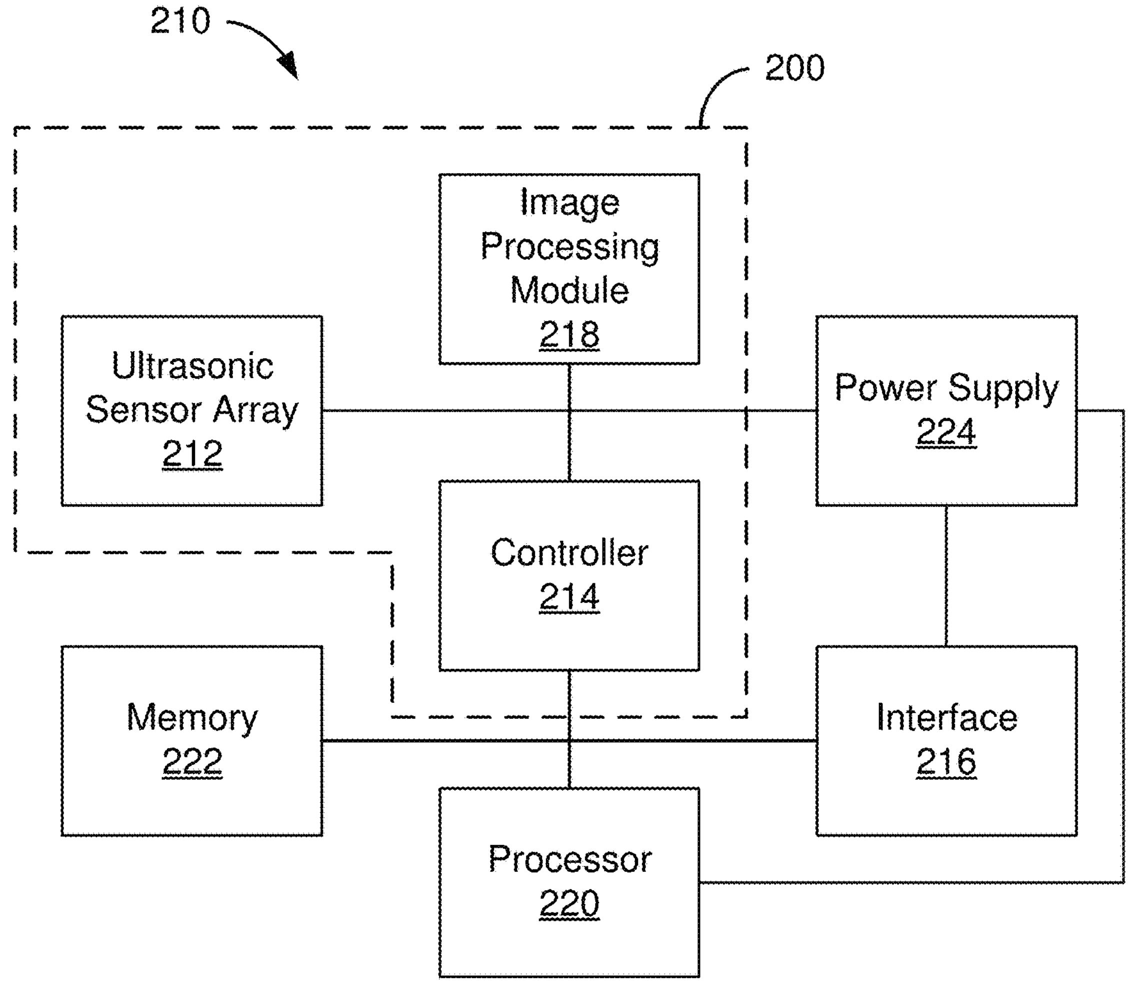
FIG. 2B shows a block diagram representation of components of an example mobile device that includes the sensing system of FIG. 2A.

FIG. 2B shows a block diagram representation of components of an example mobile device 210 that includes the sensing system 200 of FIG. 2A. The sensor system 202 of the sensing system 200 of the mobile device 210 may be implemented with an ultrasonic sensor array 212, such as the ultrasonic sensor array 100 shown in FIG. 1B. The control system 204 of the sensing system 200 may be implemented with a controller 214 that is electrically coupled to the ultrasonic sensor array 212. While the controller 214 is shown and described as a single component, in some implementations, the controller 214 may collectively refer to two or more distinct control units or processing units in electrical communication with one another. In some implementations, the controller 214 may include one or more of a general purpose single- or multi-chip processor, a central processing unit (CPU), a digital signal processor (DSP), an applications processor, an application specific integrated circuit (ASIC), a field programmable gate array (FPGA) or other programmable logic device (PLD), discrete gate or transistor logic, discrete hardware components, or any combination thereof designed to perform the functions and operations described herein.

The sensing system 200 of FIG. 2B may include an image processing module 218. In some implementations, raw measured image information provided by the ultrasonic sensor array 212 may be sent, transmitted, communicated or otherwise provided to the image processing module 218. The image processing module 218 may include any suitable combination of hardware, firmware and software configured, adapted or otherwise operable to process the image information provided by the ultrasonic sensor array 212. In some implementations, the image processing module 218 may include signal or image processing circuits or circuit components including, for example, amplifiers (such as instrumentation amplifiers or buffer amplifiers), analog or digital mixers or multipliers, switches, analog-to-digital converters (ADCs), passive or active analog filters, among others. In some implementations, one or more of such circuits or circuit components may be integrated within the controller 214, for example, where the controller 214 is implemented as a system-on-chip (SoC) or a system-in-package (SIP). In some implementations, one or more of such circuits or circuit components may be integrated within a DSP included within or coupled to the controller 214. In some implementations, the image processing module 218 may be implemented at least partially via software. For example, one or more functions of, or operations performed by, one or more of the circuits or circuit components just described may instead be performed by one or more software modules executing, for example, in a processing unit of the controller 214 (such as in a general purpose processor or a DSP).

In some implementations, in addition to the sensing system 200, the mobile device 210 may include a separate processor 220 such as an applications processor, a memory 222, an interface 216 and a power supply 224. In some implementations, the controller 214 of the sensing system 200 may control the ultrasonic sensor array 212 and the image processing module 218, and the processor 220 of the mobile device 210 may control other components of the mobile device 210. In some implementations, the processor 220 may communicate data to the controller 214 including, for example, instructions or commands. In some such implementations, the controller 214 may communicate data to the processor 220 including, for example, raw or processed image information. It should also be understood that, in some other implementations, the functionality of the controller 214 may be implemented entirely, or at least partially, by the processor 220. In some such implementations, a separate controller 214 for the sensing system 200 may not be required because the functions of the controller 214 may be performed by the processor 220 of the mobile device 210.

Depending on the implementation, one or both of the controller 214 and processor 220 may store data in the memory 222. For example, the data stored in the memory 222 may include raw measured image information, filtered or otherwise processed image information, estimated PSF or estimated image information, and final refined PSF or final refined image information. The memory 222 may store processor-executable code or other executable computer-readable instructions capable of execution by one or both of the controller 214 and the processor 220 to perform various operations (or to cause other components such as the ultrasonic sensor array 212, the image processing module 218, or other modules to perform operations), including any of the calculations, computations, estimations or other determinations described herein (including those presented in any of the equations below). It should also be understood that the memory 222 may collectively refer to one or more memory devices (or "components"). For example, depending on the implementation, the controller 214 may have access to and store data in a different memory device than the processor 220. In some implementations, one or more of the memory components may be implemented as a NOR- or NAND-based Flash memory array. In some other implementations, one or more of the memory components may be implemented as a different type of non-volatile memory. Additionally, in some implementations, one or more of the memory components may include a volatile memory array such as, for example, a type of RAM.

In some implementations, the controller 214 or the processor 220 may communicate data stored in the memory 222 or data received directly from the image processing module 218 through an interface 216. For example, such communicated data can include image information or data derived or otherwise determined from image information. The interface 216 may collectively refer to one or more interfaces of one or more various types. In some implementations, the interface 216 may include a memory interface for receiving data from or storing data to an external memory such as a removable memory device. Additionally or alternatively, the interface 216 may include one or more wireless network interfaces or one or more wired network interfaces enabling the transfer of raw or processed data to, as well as the reception of data from, an external computing device, system or server.

A power supply 224 may provide power to some or all of the components in the mobile device 210. The power supply 224 may include one or more of a variety of energy storage devices. For example, the power supply 224 may include a rechargeable battery, such as a nickel-cadmium battery or a lithium-ion battery. Additionally or alternatively, the power supply 224 may include one or more supercapacitors. In some implementations, the power supply 224 may be chargeable (or "rechargeable") using power accessed from, for example, a wall socket (or "outlet") or a photovoltaic device (or "solar cell" or "solar cell array") integrated with the mobile device 210. Additionally or alternatively, the power supply 224 may be wirelessly chargeable.

As used herein, the term "processing unit" refers to any combination of one or more of a controller of an ultrasonic system (for example, the controller 214), an image processing module (for example, the image processing module 218), or a separate processor of a device that includes the ultrasonic system (for example, the processor 220). In other words, operations that are described below as being performed by or using a processing unit may be performed by one or more of a controller of the ultrasonic system, an image processing module, or a separate processor of a device that includes the sensing system.

Figure 3:
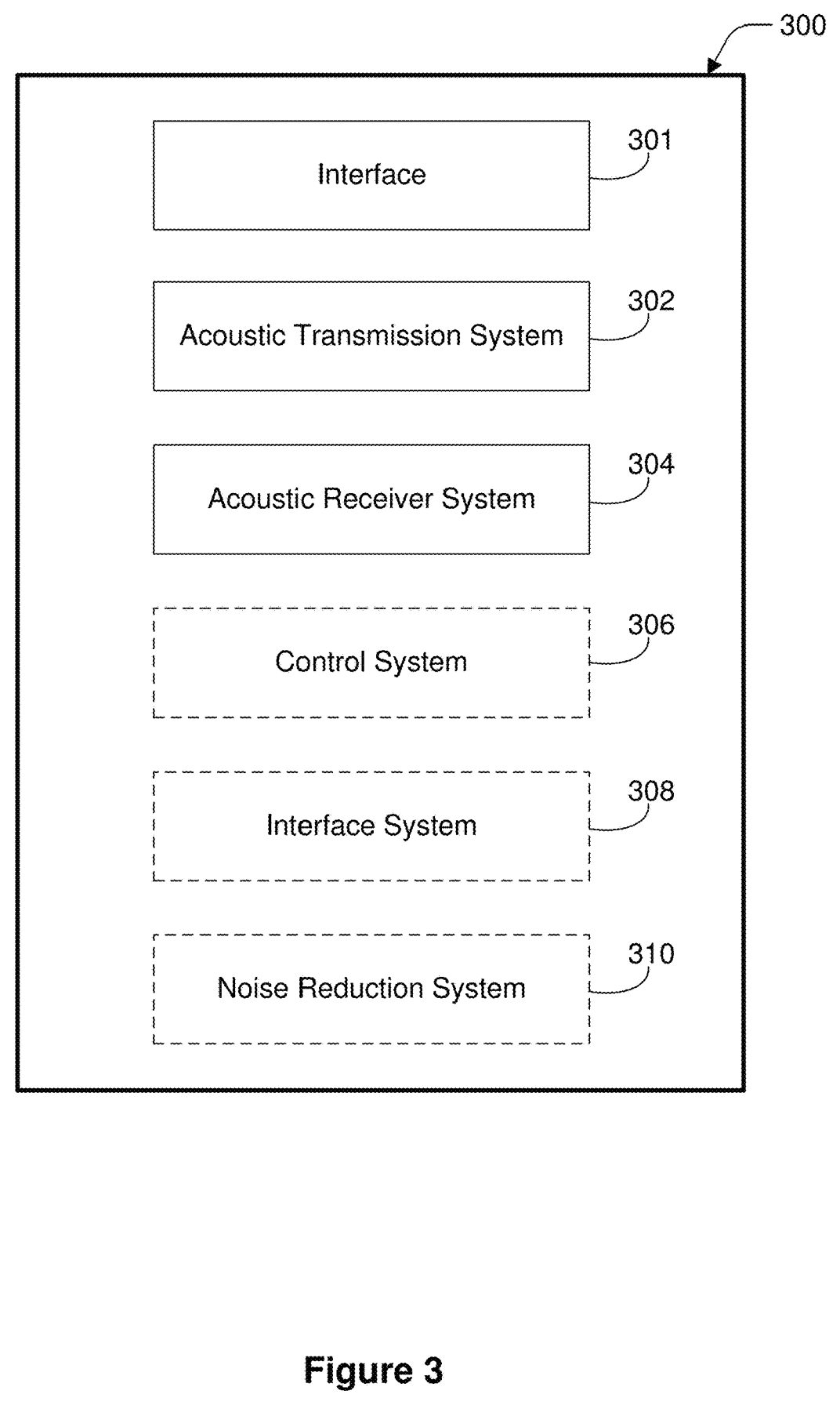

FIG. 3 is a block diagram that shows example components of a sensor apparatus 300 according to some implementations. In this example, the sensor apparatus 300 may include an interface 301 (such as a touchscreen or a platen 190), an acoustic transmission system 302, and an acoustic receiver system 304 (such as ultrasonic sensor array 100, sensor system 202, or ultrasonic sensor array 212). Some implementations of the sensor apparatus 300 may include a control system 306, an interface system 308, a noise reduction system 310, or a combination thereof. In some configurations, sensor apparatus 300 may be part of a device or another apparatus. In some configurations, sensor apparatus 300 may be a device such as that listed elsewhere above.

Various configurations of acoustic transmission system 302 and acoustic receiver system 304 are disclosed herein. Specific examples are described in more detail below.

In some embodiments, the acoustic transmission system 302 may be configured to generate and emit acoustic signals, e.g., toward a target object, such as a finger or other object. Acoustic signals may include one or more acoustic waves, such as ultrasonic waves 164 as shown in FIG. 1A. In some implementations, the acoustic transmission system 302 may include one or more ultrasonic transmitters or transmitter elements configured to generate, emit, and/or direct ultrasonic waves. The one or more ultrasonic transmitters may be one or more ultrasonic transducers. In some implementations, ultrasonic waves may be generated in a selected portion of multiple ultrasound transmitter elements (e.g., in an array). In some configurations, the one or more ultrasonic transmitter elements may be arranged in an array of ultrasonic transducer elements, such as an array of PMUTs and/or an array of CMUTs. In some examples, the ultrasonic transmitter(s) may include an ultrasonic plane-wave generator.

In some implementations, a control system 306 may include one or more controllers or processors, or a drive circuit or various types of drive circuitry, configured to control the one or more ultrasonic transmitter elements via one or more instructions to the acoustic transmission system 302. For example, ultrasonic waves may be generated in pulses (e.g., at least partly repeating or other patterns) or according to other timing instructions. Although "ultrasound" may typically apply to acoustic energy with a frequency above human hearing, or 20 kilohertz (kHz), ultrasound frequencies used for fingerprint imaging may exceed well over this lower limit. In some implementations, the control system 306 may cause ultrasonic waves from the acoustic transmission system 302 to be generated and emitted at a frequency that is between about 12 megahertz (MHz) to 50 MHz, which may result in sufficient resolution for fingerprint imaging, e.g., up to 1000 dots per inch (dpi). Other suitable frequencies may be used for the acoustic waves in other implementations.

Control system 306 may be an example of control system 204. Control system 306 may be electrically and/or communicatively coupled to the sensor apparatus 300. In some configurations, the control system 306 may be part of the sensor apparatus 300. In some configurations, the control system 306 may be part of a device having the sensor apparatus 300. In some configurations, the control system 306 may be external to the sensor apparatus 300 or the device having the sensor apparatus 300, for example but not limited to, on a server (cloud), remote storage, or another device other than the device having the sensor apparatus 300. In some configurations, the one or more controllers or processors of the control system 306 may be distributed across two or more devices including external apparatus.

In some implementations, a control system 306 may generate and emit acoustic waves in response to a detection of an object (e.g., a finger).

In some cases, the object may be detected based at least on a force applied to the sensor apparatus 300. Sensor elements 104 may be used for non-ultrasonic force detection, for example. In another example, a resistive sensor or touchscreen may allow detection of sufficient force applied to the sensor apparatus 300.

In some cases, the object may be detected based at least on light occlusion. In such cases, a light sensor may also be included with the sensor apparatus 300 so that an amount of light or its absence (e.g., relative to a threshold) can be determined, e.g., by control system 306, at or near the sensor apparatus 300.

In some cases, the object may be detected based at least on a capacitive shift or response. For example, a capacitive sensor or touchscreen may allow determination of a capacitive response based on the natural conductivity of the object such as a finger that is making contact with the interface 301 of the sensor apparatus 300.

In some implementations, a combination of one or more detection methods described above may be used to detect the object. For instance, detection of the object may require, in some configurations, sufficient force and sufficient capacitive response. In another example, detection of the object may require sufficient force, sufficient capacitive response, and sufficient absence of light.

In some configurations, a delay may be placed between the detection of the object and the emission of the acoustic waves, where the length of the delay may be 100 milliseconds, 500 milliseconds, etc. Not causing emission of acoustic waves immediately may allow time for the object to stabilize against the sensor apparatus 300 before performing, e.g., fingerprint sensing. Force or occlusion may occur even if the finger is not pressed onto the sensor apparatus 300 completely.

In some implementations, the acoustic transmission system 302 may include one or more acoustic waveguides or ultrasonic waveguides (or other sound-directing elements)

constructed to propagate and direct acoustic or ultrasonic waves toward a target location that does not have direct line of sight from at least a portion of the one or more ultrasound transmitter elements. Such waveguides may be useful in certain devices, e.g., foldable displays, or chasses that may optimize the locations of the acoustic transmission system 302 and the location of a fingerprint sensor by placing them out of direct line of sight.

The acoustic signals (e.g., ultrasonic waves) emitted from acoustic transmission system 302 may cause acoustic wave emissions to be reflected at least in part from the object (e.g., finger). As noted above, characteristics of the reflected waves such as amplitudes may depend in part on the acoustic properties of the object and/or the platen. These reflected acoustic waves (e.g., ultrasonic waves) may be detectable by the acoustic receiver system 304.

Various examples of an acoustic receiver system 304 are disclosed herein, some of which may include an ultrasonic receiver system. In some implementations, the acoustic receiver system 304 may include an ultrasonic receiver system having the one or more ultrasonic receiver elements. In some implementations, one or more ultrasonic receiver element and one or more ultrasonic transmitter elements may be combined in an ultrasonic transceiver. In some examples, the acoustic receiver system 304 may include a piezoelectric receiver layer, such as a layer of PVDF polymer or a layer of PVDF-TrFE copolymer. In some implementations, a single piezoelectric layer may serve as an ultrasonic receiver. In some implementations, other piezoelectric materials may be used in the piezoelectric layer, such as aluminum nitride (AlN) or lead zirconate titanate (PZT). According to some examples, the acoustic receiver system 304 may be, or may include, an ultrasonic receiver array. The acoustic receiver system 304 may, in some examples, include an array of ultrasonic transducer elements, such as an array of PMUTs, an array of CMUTs, etc. In some such examples, a piezoelectric receiver layer, PMUT elements in a single-layer array of PMUTs, or CMUT elements in a single-layer array of CMUTs, may be used as ultrasonic transmitters (such as those that are included in acoustic transmission system 302) as well as ultrasonic receivers. In some examples, the sensor apparatus 300 may include one or more separate ultrasonic transmitter elements or one or more separate arrays of ultrasonic transmitter elements.

A transmitter element and a receiver element may collectively or individually be referred to as a "sensor element" or an "acoustic sensor element." Such a sensor element may also refer to a transceiver element or an acoustic transceiver element.

In some other embodiments, the acoustic receiver system 304 may include one or more microphones configured to detect acoustic signals. Each microphone may be a MEMS (micro-electromechanical system) microphone having an inlet port, a cavity, and/or a membrane or mesh to facilitate detection and receipt of acoustic signals, e.g., sound waves. In some implementations, the microphone(s) may be part of another apparatus or system other than the sensor apparatus 300, such as the interface system 308 described below.

Accordingly, embodiments of sensor apparatus 300 may be configured to operate as ultrasound sensors that are configured to receive reflected acoustic signals such as ultrasonic waves. Reflected ultrasonic waves may include scattered waves, specularly reflected waves, or both scattered waves and specularly reflected waves. The reflected waves can provide acoustic data, including information about the object, e.g., a finger's ridges and valleys and their shapes and patterns.

More specifically, in some embodiments, control system 306 may be configured to receive the acoustic data (e.g., from acoustic receiver system 304) and generate images (e.g., three-dimensional images) representative of the object such as a finger. That is, fingerprint imaging may be performed using the acoustic data received by the acoustic receiver system 304. Images may be matched to a reference to identify the fingerprint image.

In some implementations, the control system 306 may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof. The control system 306 also may include (and/or be configured for communication with) one or more memory devices, such as one or more random access memory (RAM) devices, read-only memory (ROM) devices, etc. Accordingly, the sensor apparatus 300 may have a memory system that includes one or more memory devices, though the memory system is not shown in FIG. 3. The control system 306 may be configured for receiving and processing data from the acoustic receiver system 304, as described above. If the sensor apparatus 300 includes an ultrasonic transmitter, such as in the acoustic receiver system 304, the control system 306 may be configured for controlling the ultrasonic transmitter. In some implementations, functionality of the control system 306 may be partitioned between one or more controllers or processors, such as a dedicated sensor controller and an applications processor of a mobile device.

In some examples, the control system 306 may be communicatively coupled to the acoustic receiver system 304 and configured to control the acoustic receiver system 304 to emit light towards a target object (such as a finger) on an outer surface of the interface 301. In some such examples, the control system 306 may be communicatively coupled to and configured to receive signals from the acoustic receiver system 304 (including one or more receiver elements, such as sensor elements 162) corresponding to the ultrasonic waves generated by the target object responsive to the light from the light source system.

In the context of fingerprint sensing, ultrasonic fingerprint sensing may advantageously be more reliable and secure (e.g., for storing user identifying information), and have a smaller and more flexible footprint, than other types of fingerprint sensing such as traditional optical fingerprint scanning that relies on optical imaging.

Some implementations of the sensor apparatus 300 may include an interface system 308. In some examples, the interface system 308 may include a wireless interface system. In some implementations, the interface system 308 may include a user interface system, one or more network interfaces, one or more communication interfaces between the control system 306 and a memory system and/or one or more interfaces between the control system 306 and one or more external device interfaces (such as ports or applications processors), or combinations thereof. According to some examples in which the interface system 308 is present and includes a user interface system, the user interface system may include a microphone system (including, e.g., one or more microphones), a loudspeaker system, a haptic feedback system, a voice command system, one or more displays, or combinations thereof. According to some examples, the interface system 308 may include a touch sensor system, a gesture sensor system, or a combination thereof. The touch sensor system (if present) may be, or may include, a resistive touch sensor system, a surface capacitive touch sensor system, a projected capacitive touch sensor system, a surface acoustic wave touch sensor system, an infrared touch sensor system, any other suitable type of touch sensor system, or combinations thereof.

In some examples, the interface system 308 may include a force sensor system. The force sensor system (if present) may be, or may include, a piezo-resistive sensor, a capacitive sensor, a thin film sensor (for example, a polymer-based thin film sensor), another type of suitable force sensor, or combinations thereof. If the force sensor system includes a piezo-resistive sensor, the piezo-resistive sensor may include silicon, metal, polysilicon, glass, or combinations thereof. An ultrasonic fingerprint sensor and a force sensor system may, in some implementations, be mechanically coupled. In some implementations, the force sensor system may be mechanically coupled to a platen. In some such examples, the force sensor system may be integrated into circuitry of the ultrasonic fingerprint sensor. In some examples, the interface system 308 may include an optical sensor system, one or more cameras, or a combination thereof.

According to some examples, the sensor apparatus 300 may include a noise reduction system 310. In some implementations, the noise reduction system 310 may include one or more sound-absorbing layers, acoustic isolation material, or combinations thereof. In some examples, the noise reduction system 310 may include acoustic isolation material, which may reside between at least a portion of the acoustic transmission system 302 and at least a portion of the acoustic receiver system 304, e.g., between ultrasonic transmitter elements and ultrasonic receiver elements. In some examples, the noise reduction system 310 may include one or more electromagnetically shielded transmission wires. In some such examples, the one or more electromagnetically shielded transmission wires may be configured to reduce electromagnetic interference from circuitry of the acoustic transmission system 302, circuitry of the acoustic receiver system 304, or combinations thereof, that is received by the acoustic receiver system 304.

In some implementations, the sensor apparatus 300 may be part of a mobile device. In some implementations, the sensor apparatus 300 may be part of a wearable device configured to be worn by a user, such as around the wrist, finger, arm, leg, ankle, or another appendage, or another portion of the body. In an example implementation, the wearable device may have the form of a wristwatch and can be worn around the wrist.

Example Tx-Rx Arrays and Stacks

Figure 4:
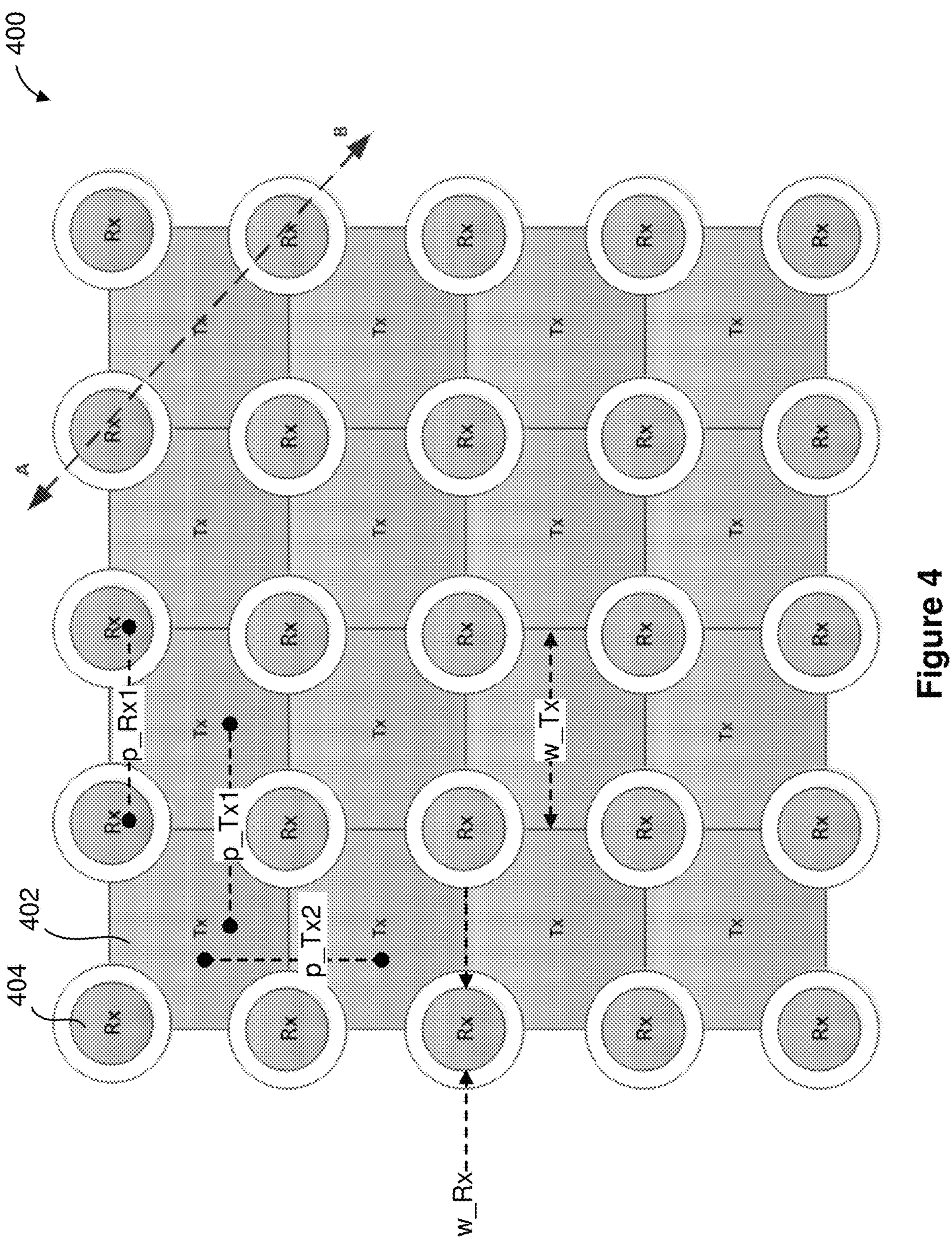
FIG. 4 shows a diagram representing an array of transmitter elements and receiver elements, according to some embodiments.

FIG. 4 shows a diagram representing an array 400 of transmitter elements 402 and receiver elements 404 of a sensor apparatus, according to some embodiments. In some embodiments, the transmitter elements 402 may be an example of the one or more ultrasonic transmitter elements of the acoustic transmission system 302 of sensor apparatus 300. Hence, the transmitter elements 402 may emit acoustic signals such as ultrasonic waves. Such ultrasonic waves may be directed toward an object, such as a finger in some scenarios. In some embodiments, the receiver elements 404 may be an example of the one or more ultrasonic receiver elements of the acoustic receiver system 304 of sensor apparatus 300, which may receive and detect acoustic signals such as ultrasonic waves, which may have been reflected from the object. The reflected ultrasonic waves may be part of acoustic data that may be used to perform fingerprint imaging as described above.

In some configurations, the transmitter elements 402 may be arranged with an equal pitch (e.g., p_Tx1) between them in at least one direction. In some configurations, the receiver elements 404 may be arranged with an equal pitch (e.g., p_Rx1) between them in at least one direction. In some configurations, the transmitter elements 402 and/or the receiver elements 404 may be arranged with different pitches between them. For example, horizontal pitch (e.g., p_Tx1) and vertical pitch (e.g., p_Tx2) may be different. In some configurations, the pitches may be substantially equal (e.g., within a range of ±1 micron (μm)).

In some configurations, a width of the transmitter elements 402 (e.g., w_Tx) and a width of the receiver elements 404 (e.g., w_Rx) may be defined. In some configurations, the transmitter elements 402 and/or the receiver elements 404 may not be symmetrical and may have further dimensions (e.g., width and length).

In some examples, a width (or a dimension) of a receiver element 404 (e.g., w_Rx) may be 37.5 μm, 50 μm, 75 μm, 100 μm, or up to 200 μm. In some examples, a width (or a dimension) of a transmitter element 402 may be 37.5 μm, 50 μm, 75 μm, 100 μm, or up to 200 μm. Hence, in some cases, there may be no difference or substantially no difference in pixel size between transmitter element 402 and receiver element 404. In some configurations, the dimensions may be switched between transmitter element 402 and receiver element 404, which will be discussed below in greater detail. Hence, in some cases, there may be no difference or substantially no difference in pixel size between transmitter element 402 and receiver element 404. In some implementations, widths and dimensions may be set by subtracting another width or dimension from a pitch. Any suitable width in a range between example values listed above or approximate to the foregoing example values may be used.

In some embodiments, the transmitter elements 402 and the receiver elements 404 may have different thicknesses. In some implementations, transmitter elements 402 may be thinner than receiver elements 404, while in some implementations, the transmitter elements 402 may be thicker than receiver elements 404. In some embodiments, voltage may be applied to different portions of a stack that forms a transmitter element 402 (e.g., a first electrode or a second electrode of the transmitter element 402) or a receiver element 404, which will be described in more detail below. In some embodiments, the transmitter elements 402 and the receiver elements 404 may be separated by a gap or break that electrically separates the transmitter elements 402 and the receiver elements 404.

These foregoing characteristics and configurations are salient distinctions from traditional sensors which advantageously open options for design in certain display devices (e.g., foldable displays) while maintaining desirable effectiveness and performance at least as much as traditional sensors (e.g., signal strength, signal-to-noise ratio (SNR), image resolution, fingerprint imaging quality, biometric performance (e.g., false rejection rate (FRR) and false acceptance rate (FAR)). Examples of these characteristics will be described with respect to the following Figures that illustrate various relevant embodiments.

Figure 5:
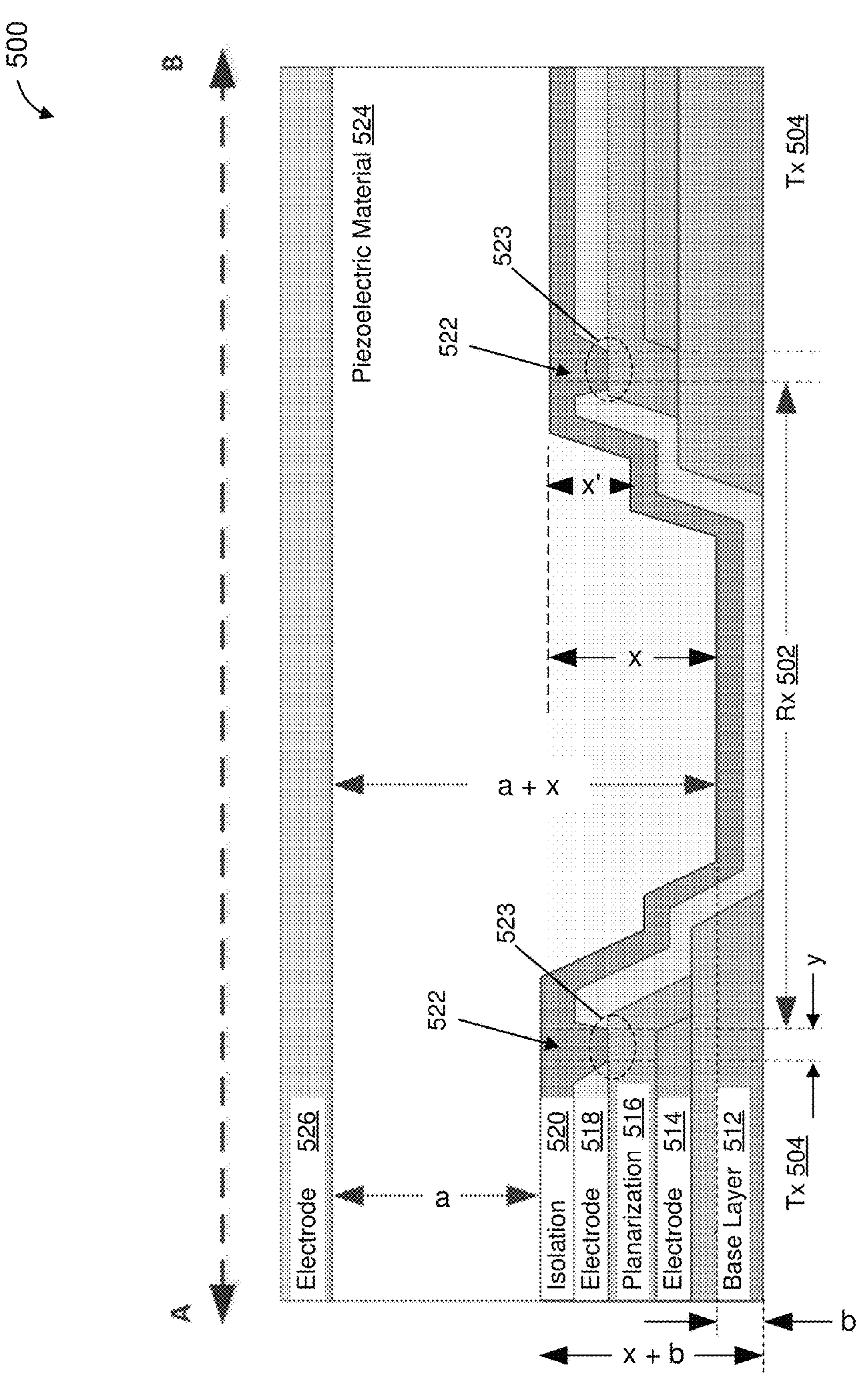
FIG. 5 shows a cross-sectional diagram of an example array of at least one receiver element and at least one transmitter element of a sensor apparatus, according to some embodiments.

FIG. 5 shows a cross-sectional diagram of an example array 500 of at least one receiver element and at least one transmitter element of a sensor apparatus, according to some embodiments. The sensor apparatus may be an example of sensor apparatus 300. The example array 500 may be a portion of array 400, where the cross-sectional view shown in FIG. 5 may be taken across line A-B shown in FIG. 4.

The example array 500 may include several layers in its stack of materials, which may vary (e.g., spatially) across portions of the example array 500. Each of those portions of the example array 500 may include a stack of materials that corresponds to a receiver element 502 or a transmitter element 504, whose operation may, in some implementations, be dictated by how voltage is applied or not applied (e.g., via grounding) to the stack of materials. The application of voltage to induce different functionalities will be discussed elsewhere below.

As can be noticed in FIG. 5 and will be discussed further below, there are fewer layers of material in the portion that corresponds to the receiver element 502 as compared to the portions that correspond to the transmitter elements 504. Third electrode layer 526 may be flat across the receiver elements 502 and the transmitter elements 504, while piezoelectric material 524 may occupy the additional space resulting from having fewer materials in the stack at the portion corresponding to the receiver element 502 (e.g., across the arrows representing distances x and x'). This creates a difference in thicknesses associated with the receiver element(s) 502 and the transmitter element(s) 504. More specifically, in some embodiments, the piezoelectric material 524 may have a thickness of a at the portion corresponding to the transmitter element 504, which may also be equal to the distance between a surface of the isolation layer 520 and a surface of the third electrode layer 526. Further, the piezoelectric material 524 may have a thickness of $\alpha+x$ at least at some portion corresponding to the receiver element 502, where x may be equal to the distance between the same surface of the isolation layer 520 and the same surface of the isolation layer 520 at the receiver element 502. The thickness $\alpha+x$ of the piezoelectric material 524 at the portion corresponding to the receiver element 502 may be equal to the distance between the surface of the isolation layer 520 at the portion corresponding to the receiver element 502 and the surface of the third electrode layer 526. As a result, at least some portion of the receiver element 502 may have a thickness b, and the transmitter element 504 may have a thickness x+b.

In some implementations, $\alpha+x$ may have a value of up to 9 μm. In some implementations, x may have a value of up to 8 μm. For instance, x may be equal to or approximately equal to 2, 3.8, 4, 6 or 8 μm depending on the configuration. In some implementations, x may have a value of up to 25 μm. For instance, x may be equal to or approximately equal to 5, 10 or 25 μm depending on the configuration. In some implementations, $\alpha+x+b$ may have a value of up to 9 μm, and x+b may have a value of up to 8 μm. In some implementations, the third electrode layer 526 may have a thickness of up to about 20 μm, for example 18 μm. In some implementations, $\alpha+x+b$ may have a value of up to 30 μm. For example, $\alpha+x$ may be 9 μm, and the third electrode layer 526 may be 18 μm thick, for a total of 27 μm.

The difference x representing the difference in the height of the stacks of material associated with the receiver element(s) 502 and the transmitter element(s) 504 is one salient feature of the example array 500 of the sensor apparatus, as well as of other embodiments of the sensor apparatus disclosed herein. The difference in thicknesses associated with the receiver element(s) 502 and the transmitter element(s) 504 can result in greater flexibility in implementation of a sensor apparatus having the example array 500 in a device or a display of a device, as well as performance in certain types of devices or displays, for example a foldable display.

Moreover, in different configurations, the difference x and the heights of receiver element(s) 502 and transmitter element(s) 504, b and x+b respectively, can vary to emphasize the performance of either the receiver element(s) 502 and/or the transmitter element(s) 504. If greater receiver performance is desired, a lower height value b corresponding to the height of the receiver element(s) 502 may be used. That is, a larger thickness $\alpha+x$ of the piezoelectric material 524 corresponding to the receiver element(s) 502 may be used, while maintaining some difference x. If greater transmitter performance is desired, a lower height value x+b corresponding to the height of the transmitter element(s) 504 may be used. That is, a larger thickness $\alpha$ of the piezoelectric material 524 corresponding to the transmitter element(s) 504 may be used, while maintaining some difference x.

Figure 6:
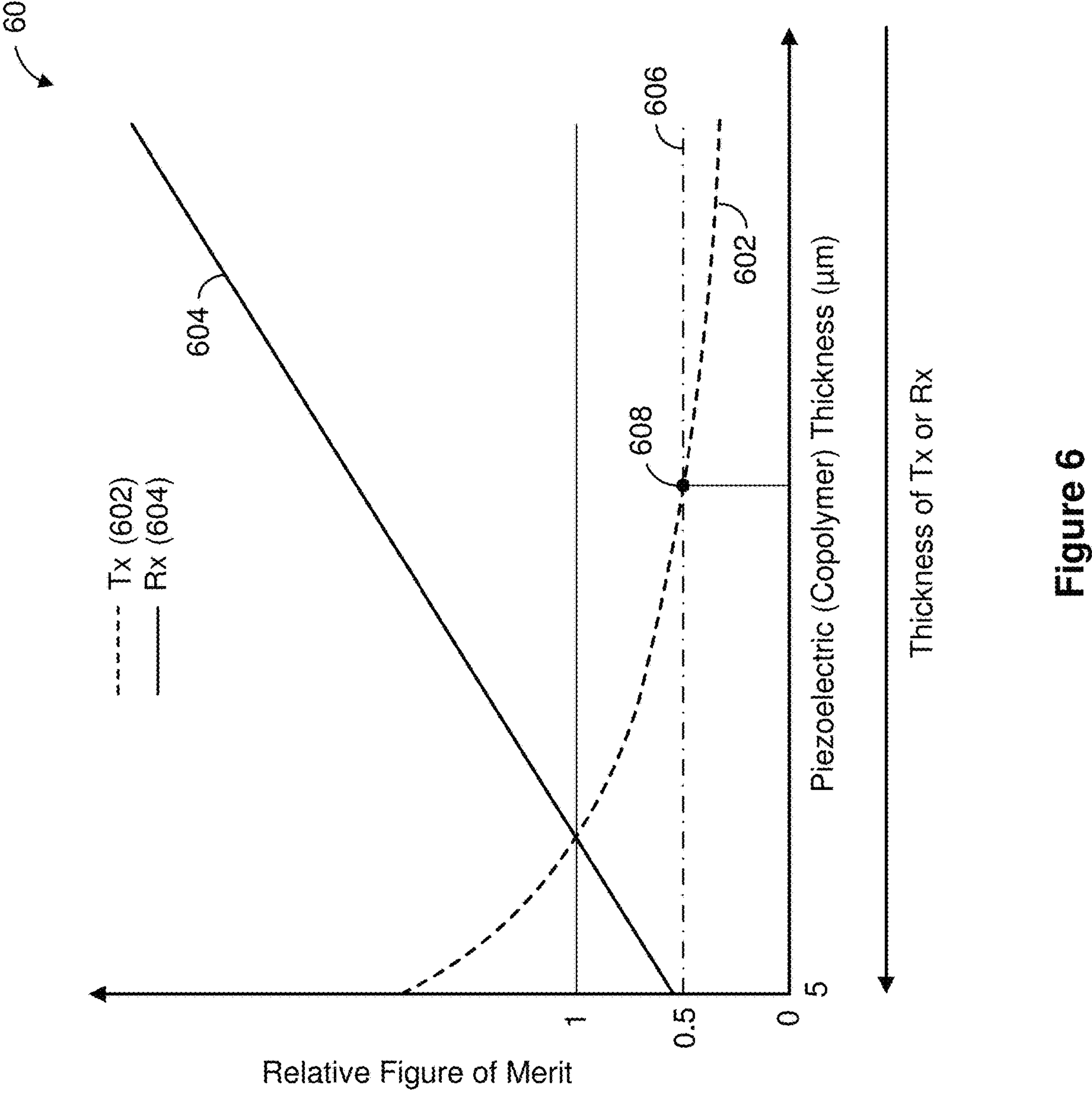
FIG. 6 shows a graph illustrating the relative figures of merit as a function of the thickness of a transmitter element and a receiver element.

FIG. 6 shows a graph 600 illustrating the relative figures of merit as a function of the thickness of a receiver element (e.g., 502) and a transmitter element (e.g., 504). A "figure of merit" as used herein may refer to a relative performance metric associated with a device. In the context of FIG. 6, the figure of merit may characterize a performance of a receiver element or a transmitter element, e.g., signal quality (signal-to-noise ratio), signal strength, image resolution (e.g., measured in line pairs per millimeter (LPMM)). The figures of merit shown in the graph 600 may be obtained using simulated conditions and constants as a function of the thickness of a piezoelectric material 524 corresponding to the receiver element 502 or the transmitter element 504 (which in turn is directly or inversely correlated to the thickness or height of the receiver element 502 and the transmitter element 504, respectively). In some approaches, the figure of merit for the receiver element 502 may be determined using a piezoelectric voltage constant over the thickness of the piezoelectric material 524, and the figure of merit for the transmitter element 504 may be determined using a piezoelectric charge constant times thickness of the piezoelectric material 524 over a dielectric constant. Graph 600 may result from a theoretical determination and projection with an assumption that x=0, such that the thickness of the piezoelectric material 524 is uniform across the receiver element 502 and the transmitter element 504. However, the figure of merit and relative figures of merit can still be estimated based on the thickness difference being some amount of x.

Referring to the graph 600, note (i) the relationship between the thickness of the piezoelectric material 524 corresponding to the receiver element 502 and the figure of merit 602 of the receiver element 502, (ii) the relationship between the thickness of the piezoelectric material 524 corresponding to the transmitter element 504 and the figure of merit 604 of the transmitter element 504, and (iii) the relationship between the figures of merit 602, 604 of the receiver element 502 and the transmitter element 504.

Specifically, as the thickness of the piezoelectric material 524 increases for the receiver element 502 and the thickness of the receiver element 502 (stack of layers of material associated therewith) thereby decreases, the figure of merit 602 of the receiver element 502 decreases. Additionally, as the thickness of the piezoelectric material 524 increases for the transmitter element 504 and the thickness of the transmitter element 504 (stack of layers of material associated therewith) thereby decreases, the figure of merit 604 of the transmitter element 504 increases. Lastly, if the thickness of the piezoelectric material 524 is the same at both the receiver element 502 and the transmitter element 504, a difference performance is not seen. In the embodiments described herein, however, some difference x between the heights of the receiver element 502 and the transmitter element 504 may exist. Therefore, a difference in performance may also exist between the receiver element 502 and the transmitter element 504. The greater the difference x, the greater the figure of merit of either the receiver element 502 or the transmitter element 504. As stated above, the performance may be modified as desired by adjusting the thickness of the piezoelectric material 524 at corresponding portions of the example array 500, e.g., at the receiver elements 502 or the transmitter elements 504. However, in some approaches, while some level of performance degradation at either the receiver elements 502 or the transmitter elements 504 may be acceptable, there may be a threshold figure of merit 606 (e.g., 0.5 on a normalized scale, or another suitable threshold level or performance floor) that the receiver elements 502 or the transmitter elements 504 should have. Thus, in examples where the threshold figure of merit 606 is applied, thicknesses of the piezoelectric material 524 (and hence the receiver elements 502 or the transmitter elements 504, inversely) may be limited to a maximum thickness indicated by the point 608 to maintain an acceptable level of performance by the receiver elements 502 and the transmitter elements 504.

Referring back to FIG. 5, in some embodiments, the example array 500 may include, in some portions of the example array 500 (e.g., corresponding to the receiving elements 504), a stack of materials that include a base layer 512, a first electrode layer 514, a planarization layer 516, a second electrode layer 518, an isolation layer 520, a piezoelectric material 524, and a third electrode layer 526. In some embodiments, the foregoing layers may be present in the portions of the example array 500 that correspond to a transmitter element 504. In FIG. 5, two transmitter elements 504 are shown, on the left side and the right side of the cross-sectional view. Hence, the same layers as above are present on the left side and the right side of the cross-sectional view which correspond to transmitter elements 504.

In some portions of the example array 500 that correspond to a receiver element 502, a stack of materials may include the second electrode layer 518, the isolation layer 520, the piezoelectric material 524, and the third electrode layer 526.

In some approaches, the base layer 512 may be the first layer that is formed when creating the stack of material. The other layers can be formed over the base layer and form a structure such as the example array 500 shown in FIG. 5. In some embodiments, the base layer 512 may include a dielectric layer. Example materials for this dielectric layer may include silicon oxide or silicon nitride. In some implementations, the base layer 512 may include more than one dielectric layer.

In some embodiments, the first electrode layer 514 may include one or more electrically conductive layers. In some implementations, the first electrode layer 514 may include at least one metallic layer. For example, the first electrode layer 514 may be a trilayer of titanium, aluminum, and titanium.

In some embodiments, the planarization layer 516 may be made of a resin material. Examples of such a resin material may include an epoxy, polyester, polyurethane, phenol formaldehyde, an acrylic, silicone, ultraviolet-cured resin, or a combination thereof.

In some embodiments, the second electrode layer 518 may include one or more electrically conductive layers. In some implementations, the second electrode layer 518 may be a layer of indium tin oxide (ITO), which may be an alloy composed of indium, tin, and oxygen in a selected proportion (such as a 74% In, 8% Sn, and 18% O by weight).

In some embodiments, the isolation layer 520 may include a dielectric layer. For example, the material for this dielectric layer may be, e.g., silicon oxide or silicon nitride. In some implementations of the isolation layer 520, the silicon oxide may have a composition of SiOx. Alternatively, the silicon nitride may have a composition of $SiN_x$.

"Silicon oxide" is referred to herein as including any and all stoichiometric possibilities for $Si_xO_y$, including integer values of x and y and non-integer values of x and y. For example, "silicon oxide" includes compounds having the formula $SiO_n$, where 1<n<2, where n can be an integer or non-integer values. "Silicon oxide" can include sub-stoichiometric compounds such as $SiO_{1.8}$. "Silicon oxide" may also include silicon dioxide ($SiO_2$) and silicon monoxide (SiO). Undoped silicate glass (USG) may be another example of "silicon oxide." "Silicon oxide" may include both natural and synthetic variations and also includes any and all crystalline and molecular structures, including tetrahedral coordination of oxygen atoms surrounding a central silicon atom. "Silicon oxide" may include amorphous silicon oxide and silicates.

"Silicon nitride" is referred to herein as including any and all stoichiometric possibilities for $Si_xN_y$, including integer values of x and y and non-integer values of x and y. For example, "silicon nitride" includes compounds having the formula SiN. "Silicon nitride" may include both natural and synthetic variations and also includes any and all crystalline and molecular structures. "Silicon nitride" may include amorphous silicon nitride and silicates.

Another salient feature of embodiments of the example array 500 is an electrical separation 522 or gap between the transmitter element 504 and the receiver element 502.

FIG. 5 shows two examples of the electrical separation 522. Such electrical separations 522 may be made using the isolation layer 520. For instance, a physical notch 523 may extend from the isolation layer 520. In some embodiments, the physical notch 523 may contact the planarization layer 516 so as to isolate the second electrode layer 518 at the portion corresponding to the transmitter element 504 from the second electrode layer 518 at the portion corresponding to the receiver element 502. However, in some implementations, the physical notch 523 may not contact the planarization layer 516. Instead, the second electrode layer 518 may be discrete parts that are not physically or electrically connected. In some variations, the physical notch 523 may not be implemented, and the second electrode layer 518 at the portion corresponding to the transmitter element 504 may be secured relative to the planarization layer 516 and/or the isolation layer 520 (e.g., via adhesive, friction, or physical features not shown in the cross-sectional view) so as to not make contact with the second electrode layer 518 at the portion corresponding to the receiver element 502, which may be secured relative to the other layers shown (e.g., planarization layer 516, base layer 512, isolation layer 520) by way of, e.g., adhesive, friction, or physical features such as the edges and notches formed by the aforementioned other layers).

The electrical separation 522 may advantageously allow applying voltage to the receiver element 502 or the transmitter element 504 separately. As will be discussed further below, individual applications of voltage and grounding of each of receiver element 502 and the transmitter element 504 allow the receiver element 502 and the transmitter element 504 to each act as independent pixels within the same sensor apparatus.

In some cases, these layers may be processed and manufactured at a TFT (thin-film transistor) fabrication facility.

Subsequently, the piezoelectric material 524 may be applied as a coating over these layers.

In some embodiments, the piezoelectric material 524 may transmit acoustic (e.g., ultrasonic) signals. In some embodiments, the copolymer may be a semifluid substance that is applied as a coating over the other layers underneath (discussed above) and automatically planarized during processing. Coating speed, temperature for curing, viscosity of the copolymer material may vary depending on different approaches. In some cases, the piezoelectric material 524 may be made of a copolymer material, such as vinylidene cyanide, vinyl acetate, or another polymer having two or more species (i.e., a copolymer) such as poly(vinylidene fluoride-co-trifluoroethylene) (PVDF-TrFE). In some cases, lead zirconate titanate (PZT or Pb(ZrTi)) may be used. In some cases, other types of amorphous or semi-crystalline polymers may be used such that the polymer may have some fluidity, semifluidity, or viscosity, a characteristic that enables the polymer to be flowed onto the other layers during processing and manufacturing. Examples may include polyvinylidene fluoride (PVDF), polyimide, or polyvinylidene chloride (PVDC). In some specific cases, a carbon-nanotube-embedded copolymer or a carbon-particle-embedded copolymer may be used. In general, engineered piezoelectric polymers, ceramics, and single-crystal materials may be used.

The copolymer may have different thicknesses at different portions of the example array 500 by nature of the different heights associated with the stacks of material at portions corresponding to receiver element(s) and transmitter element(s). As mentioned previously, in the example array 500, the piezoelectric material 524 may have a thickness of $\alpha$+x at the portion corresponding to the receiver element 502, and the piezoelectric material 524 may have a thickness of a at the portion corresponding to the transmitter element 504. However, the top surface of the piezoelectric material 524 may be flat or substantially as a result of the fluidity or semifluidity of the copolymer or polymer before solidification.

In some embodiments, a third electrode layer 526 may include one or more electrically conductive layers. In some implementations, the third electrode layer 526 may include a layer of silver (Ag). The third electrode layer 526 may be laid over the flat surface of the piezoelectric material 524, thereby completing the stacks of materials corresponding to the receiver element 502 and the transmitter elements 504 as shown in FIG. 5.

In some embodiments, the layers discussed herein may be arranged according to what is shown in FIG. 5. However, in some other embodiments, there may be fewer layers as shown in FIG. 5. In some other embodiments, there may be multiple instances of a given layer, whether disposed adjacent to one another or disposed elsewhere within the stack.

Figure 5A:
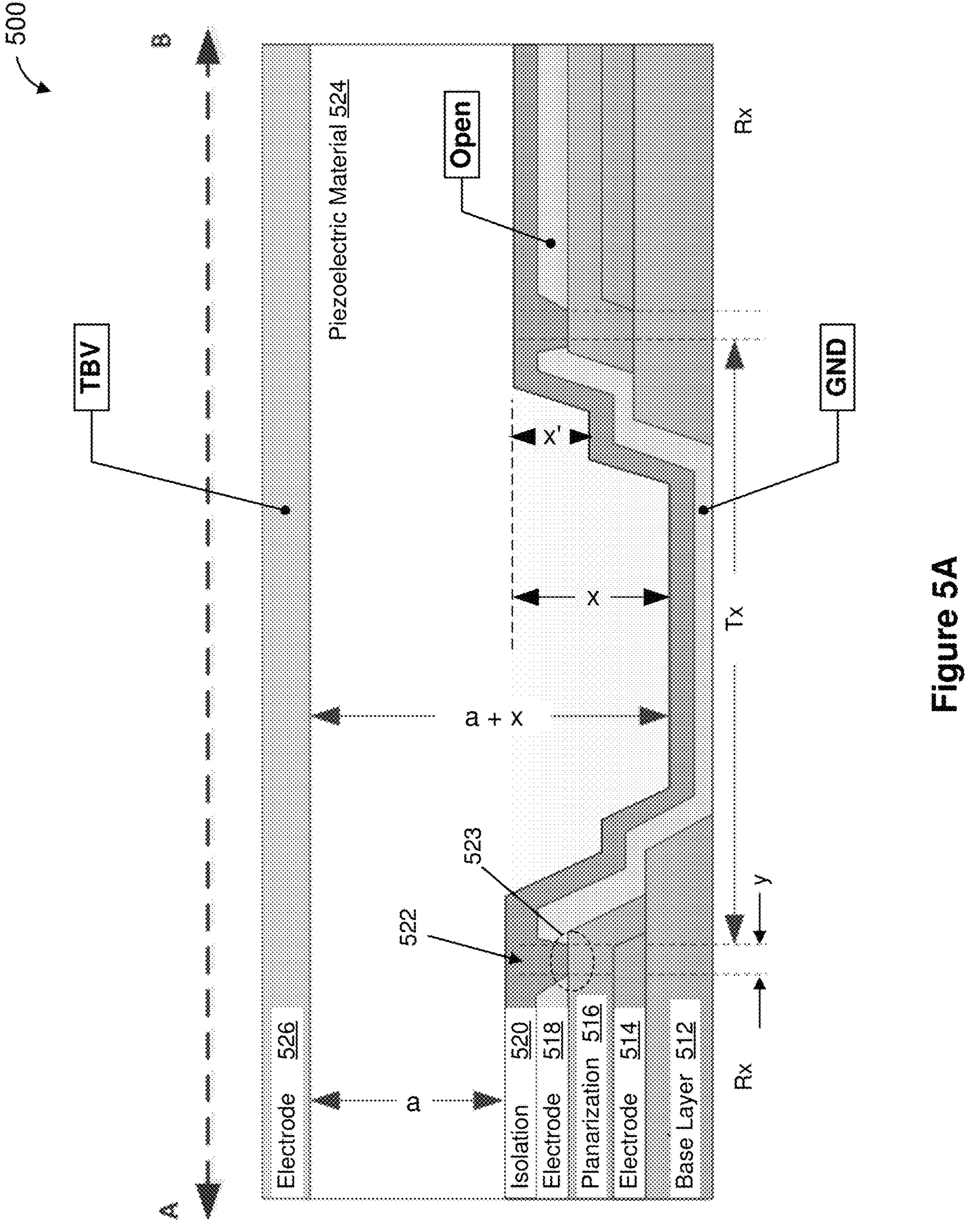
FIGS. 5A-5C depict different configurations for transmitting or receiving acoustic signals using the example array of FIG. 5.
Figure 5B:
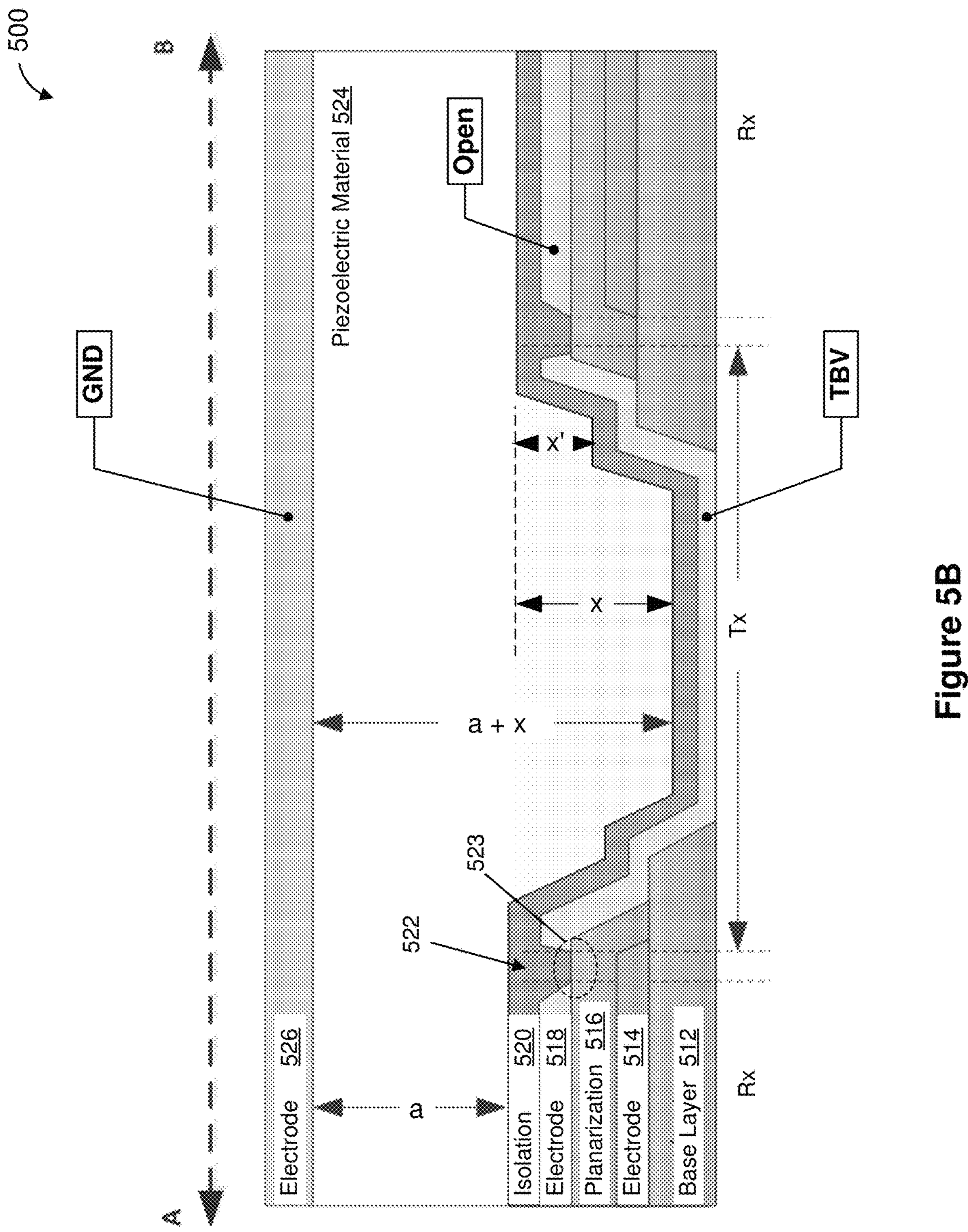
Figure 5C:
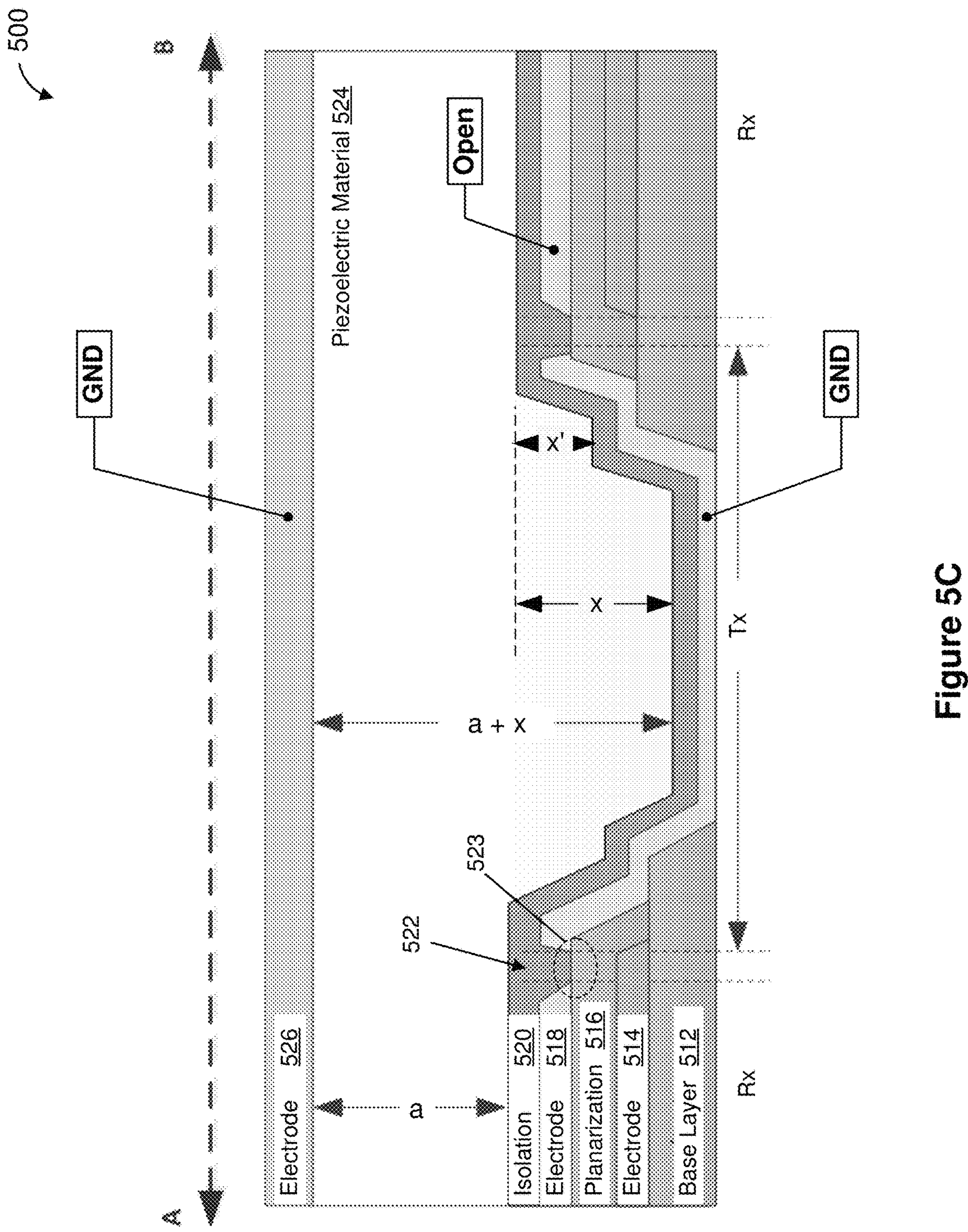

In some embodiments, there may be one receiver element 502 entrenched between two transmitter elements 504, as shown in FIGS. 5-5C, for example. In other words, there may be one receiver element 502 for every two transmitter elements 504.

In other embodiments, however, there may be one transmitter element 504 for every two receiver elements 502 in such embodiments. That is, an array of transmitter elements and receiver elements may have one transmitter element entrenched between two receiver elements, and the positions of Tx and Rx would be switched as compared to FIGS. 5-5C.

As noted previously, voltage may be applied to different portions of the stacks of material, and some portions may be grounded while voltage is applied to other portions. Different configurations are discussed now.

Transmission of acoustic signals using example array 500 of a sensor apparatus may be performed in a first configuration and a second configuration (or a first mode or a second mode, respectively). In the first configuration, voltage may be applied to the third electrode layer 526, the second electrode layer 518 corresponding to the receiver element 502 may be open, and the second electrode layer 518 corresponding to the transmitter element 504 may be grounded. In some implementations, the voltage applied to the third electrode layer 526 (and the piezoelectric material 524 thereby) may be tone burst voltage (TBV), which may cause the transmitter element 504 to generate a tone burst. A tone burst may refer to a short signal which may make it possible to differentiate a desired signal from noise such as spurious reflections. In an environment full of reflections, a tone burst helps determine the direction and frequency of a specific reflection. In some examples, a tone burst of one microsecond or less (e.g., 0.33 μs) may be emitted based on the corresponding TBV applied to the third electrode layer 526.

In other embodiments in which the Tx and Rx are switched, depicted in FIG. 5A, voltage (e.g., TBV) may be applied to the third electrode layer 526, the second electrode layer 518 corresponding to the (now) transmitter element between two (now) receiver elements may be grounded, and the second electrode layer 518 corresponding to the (now) receiver element (left and right side) may be open.

In the second configuration, voltage may be applied to the second electrode layer 518 corresponding to the transmitter element 504, the third electrode layer 526 may be grounded, and the second electrode layer 518 corresponding to the receiver element 502 may be open. In some implementations, the voltage applied to the second electrode layer 518 corresponding to the transmitter element 504 may be TBV. In some examples, a tone burst generated and emitted based on the TBV may last up to one microsecond.

In other embodiments in which the Tx and Rx are switched, depicted in FIG. 5B, voltage (e.g., TBV) may be applied to the second electrode layer 518 corresponding to the (now) transmitter element between the two (now) receiver elements, the third electrode layer 526 may be grounded, and the second electrode layer 518 corresponding to the (now) receiver element (left and right side) may be open.

Reception of acoustic signals may be performed in a third configuration (or a third mode). In the third configuration, no voltage needs to be applied to the second electrode layer 518 corresponding to the transmitter element 504, or the third electrode layer 526. In some implementations, the second electrode layer 518 corresponding to the receiver element 502 may be open, and the second electrode layer 518 corresponding to the transmitter element 504, and the third electrode layer 526, may be grounded. Acoustic (e.g., ultrasonic) signals may be received at the open portion of the second electrode layer 518. In some cases, the open portion of the second electrode layer 518 may possess parasitic impedance.

In other embodiments in which the Tx and Rx are switched, depicted in FIG. 5C, no voltage needs to be applied to the second electrode layer 518 corresponding to the (now) receiver element (left and right side), or the third electrode layer 526. In some implementations, the second electrode layer 518 corresponding to the (now) receiver element (left and right side) may be open, and the second electrode layer 518 corresponding to the (now) transmitter element between the two (now) receiver elements, and the third electrode layer 526, may be grounded.

In some implementations, each of the first, second, and third configurations or modes depicted in FIGS. 5A-5C may apply to the example array 500. Hence, in a signal transmitting mode, one of two configurations (such as the first or second configuration) may be implemented with the example array 500 of a sensor apparatus. In a signal receiving mode, one configuration such as the third configuration may be implemented with the example array 500 of the sensor apparatus. However, in some implementations, these three configurations or modes may apply to other stacks of material and arrangements of layers, as will be discussed below.

Figure 7:
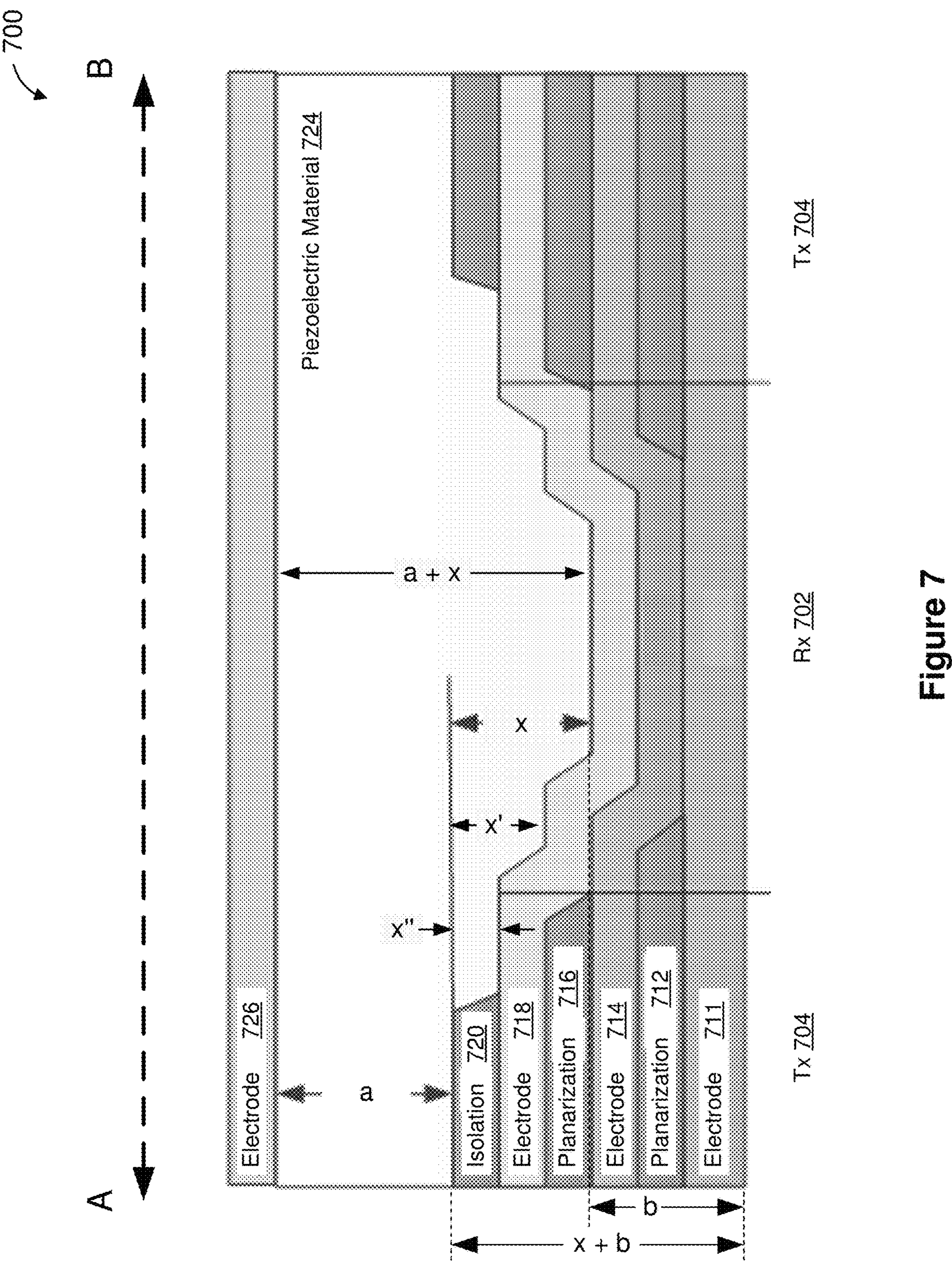
FIG. 7 shows a cross-sectional diagram of an example array of at least one receiver element and at least one transmitter element, according to some embodiments.

FIG. 7 shows a cross-sectional diagram of an example array 700 of at least one transmitter element and at least one receiver element of a sensor apparatus, according to some embodiments. The sensor apparatus may be an example of sensor apparatus 300. The example array 700 may be a portion of array 400, where the cross-sectional view shown in FIG. 7 may be taken across line A-B shown in FIG. 4.

The example array 700 may include several layers in its stack of materials, which may vary (e.g., spatially) across portions of the example array 700. Each of those portions of the example array 700 may include a stack of materials that corresponds to a receiver element 702 or a transmitter element 704, whose operation may, in some implementations, be dictated by how voltage is applied or not applied (e.g., via grounding) to the stack of materials. The application of voltage to induce different functionalities will be discussed elsewhere below.

As can be noticed in FIG. 7 and will be discussed further below, there are fewer layers of material in the portion that corresponds to the receiver element 702 as compared to the portions that correspond to the transmitter elements 704. Piezoelectric material 724 may occupy the additional space resulting from having fewer materials in the stack at the portion corresponding to the receiver element 702 (e.g., across the arrows representing distances x and x'). This creates a difference in thicknesses associated with the receiver element(s) 702 and the transmitter element(s) 704. More specifically, in some embodiments, the piezoelectric material 724 may have a thickness of distance a at the portion corresponding to the transmitter element 704, which may also be equal to the distance between a surface of the isolation layer 720 and a surface of fourth electrode layer 726. Further, the piezoelectric material 724 may have a thickness of $\alpha$+x at least at some portion corresponding to the receiver element 702, where x may be equal to the distance between the same surface of the isolation layer 720 and a surface of electrode 718 at the receiver element 702. The thickness $\alpha$+x of the piezoelectric material 724 at the portion corresponding to the receiver element 702 may be equal to the distance between the surface of the electrode 718 at the portion corresponding to the receiver element 702 and the surface of the fourth electrode layer 726. As a result, at least some portion of the receiver element 702 may have a thickness b, and at least some portion of the transmitter element 704 may have a thickness x+b.

In some implementations, a may have a value of up to 9 μm. In some implementations, $\alpha$+x may have a value of up to 13 μm. For instance, $\alpha$+x may be equal to about 12.8 μm. In some implementations, x may have a value of up to 8 μm. For instance, x may be equal to about 3.8 μm. In some implementations, x may have a value of up to 25 μm. In some implementations, b may have a value of up to 8 μm. In some implementations, x+b may have a value of up to 8 μm.

The difference x representing the difference in the height of the stacks of material associated with the receiver element(s) 702 and the transmitter element(s) 704 is one salient feature of the example array 700 of the sensor apparatus, as well as of other embodiments of the sensor apparatus disclosed herein. The difference in thicknesses associated with the receiver element(s) 702 and the transmitter element(s) 704 can result in greater flexibility in implementation of a sensor apparatus having the example array 700 in a device or a display of a device, as well as performance in certain types of devices or displays, for example a foldable display.

In different configurations, the difference x and the heights of receiver element(s) 702 and transmitter element(s) 704, b and x+b respectively, can vary to emphasize the performance of either the receiver element(s) 702 and/or the transmitter element(s) 704. For example, if greater receiver performance is desired, a lower height value b corresponding to the height of the receiver element(s) 702 may be used. Alternatively, if greater receiver performance is desired, a lower height value x+b corresponding to the height of the transmitter element(s) 704 may be used.

According to the relative figures of merit shown in graph 600, a tradeoff of performances of the receiver element(s) 702 and the transmitter element(s) 704 may be achieved based on the thickness or the height of the receiver element(s) 702 and the transmitter element(s) 704. The greater the difference x, the greater the figure of merit of either the receiver element 702 or the transmitter element 704.

Referring back to FIG. 7, in some embodiments, the example array 700 may include, in some portions of the example array 700 (e.g., corresponding to the transmitter elements 704), a stack of materials that include a first electrode layer 711, a first planarization layer 712, a second electrode layer 714, a second planarization layer 716, a third electrode layer 718, an isolation layer 720, a piezoelectric material 724, and a fourth electrode layer 726. In some embodiments, the foregoing layers may be present in the portions of the example array 700 that correspond to a transmitter element 704. In FIG. 7, two transmitter elements 704 are shown, on the left side and the right side of the cross-sectional view. Hence, the same layers as above are present on the left side and the right side of the cross-sectional view which correspond to transmitter elements 704.

In some portions of the example array 700 that correspond to a receiver element 702, a stack of materials may include the first electrode layer 711, the electrode layer 714, the third electrode layer 718, the piezoelectric material 724, and the fourth electrode layer 726. In some implementations, a portion of the first planarization layer 712 and/or the second planarization layer 716 may also be included. In some implementations, isolation layer 720 may only be present in portions of the example array 700 that correspond to a transmitter element 704 and not in portions that correspond to the receiver element 702. This difference in which layers are included may further create a distance x".

In some embodiments, the first electrode layer 711 may include one or more electrically conductive layers. In some implementations, the first electrode layer 711 may include at least one metallic layer.

In some embodiments, the first planarization layer 712 and the second planarization layer 716 may each be an example of the planarization layer 516 discussed with respect to FIG. 5.

In some embodiments, the second electrode layer 714 may be an example of the first electrode layer 514. In some implementations, the first electrode layer 514 may include at least one metallic layer. For example, the second electrode layer 714 may be a trilayer of titanium, aluminum, and titanium.

In some embodiments, the third electrode layer 718 may be an example of the second electrode layer 518. In some implementations, the third electrode layer 718 may be a layer of indium tin oxide (ITO).

In some embodiments, the isolation layer 720 may be an example of the isolation layer 520 and may include a dielectric layer. The material for this dielectric layer may be, e.g., silicon oxide or silicon nitride.

In some embodiments, there may be one receiver element 702 entrenched between two transmitter elements 704, as shown in FIG. 7. In other words, there may be one receiver element 702 for every two transmitter elements 704. In other embodiments, however, an array of transmitter elements and receiver elements may have one transmitter element entrenched between two receiver elements, as will be discussed below. That is, there may be one transmitter element 704 for every two receiver elements 702 in such embodiments.

Note that, in example array 700, an electrical separation using a physical notch (such as physical notch 523) may not be present. However, by virtue of applying voltage to, or grounding, the receiver element 702 and/or the transmitter element 704 (more specifically, the electrodes therein), as will be described below, the receiver element 702 and the transmitter element 704 may independently operate as receiver and receiver of acoustic (e.g., ultrasonic) signals.

In some implementations, however, a physical notch may be present to create an electrical separation between the receiver element 702 and the transmitter element 704.

In some embodiments, the piezoelectric material 724 may be an example of the piezoelectric material 524. Hence, a copolymer or a polymer material may be applied as a coating to form the piezoelectric material 724.

In some embodiments, the fourth electrode layer 726 may be an example of the third electrode layer 526. In some implementations, the fourth electrode layer 726 may include a layer of silver (Ag). The fourth electrode layer 726 may be laid over the flat surface of the piezoelectric material 724, thereby completing the stacks of materials corresponding to the receiver element 702 and the transmitter elements 704 as shown in FIG. 7.

In some embodiments, the layers discussed herein may be arranged according to what is shown in FIG. 7. However, in some other embodiments, there may be fewer layers as shown in FIG. 7. In some other embodiments, there may be multiple instances of a given layer, whether disposed adjacent to one another or disposed elsewhere within the stack.

As noted previously, voltage may be applied to different portions of the stacks of material, and some portions may be grounded while voltage is applied to other portions. Different configurations are discussed now.

Transmission of acoustic signals using example array 700 of a sensor apparatus may be performed in a first configuration and a second configuration (or a first mode or a second mode). In the first configuration depicted in FIG. 7A, voltage may be applied to the fourth electrode layer 726, and the first, second, and third electrode layers 711, 714, and 718 may be grounded. In some implementations, the voltage applied to the fourth electrode layer 726 may be TBV, which may cause the transmitter element 704 to generate a tone burst. In some examples, a tone burst generated and emitted based on the TBV may last up to one microsecond.

Figure 7A:
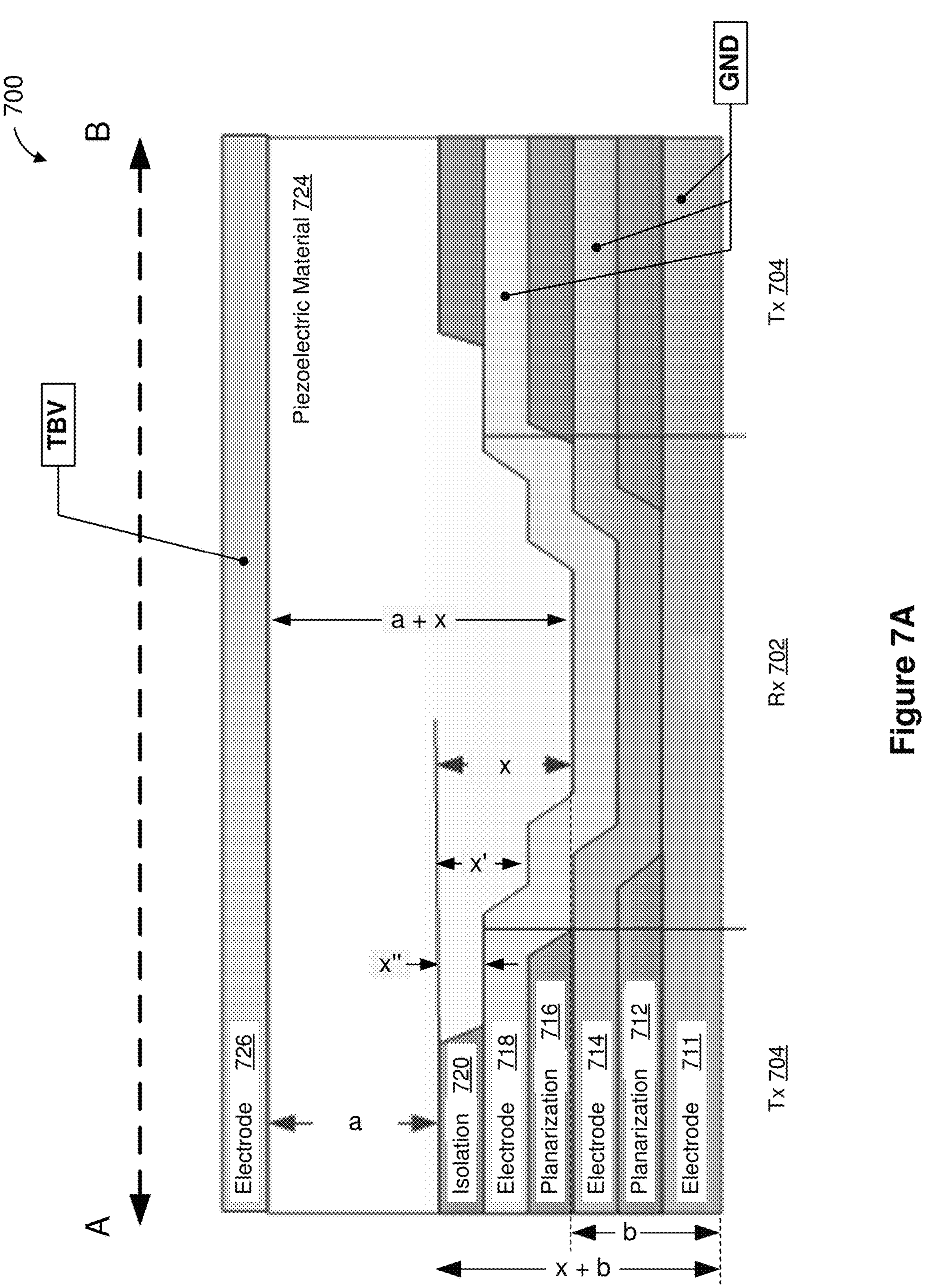
FIGS. 7A-7C depict different configurations for transmitting or receiving acoustic signals using the example array of 7.
Figure 7B:
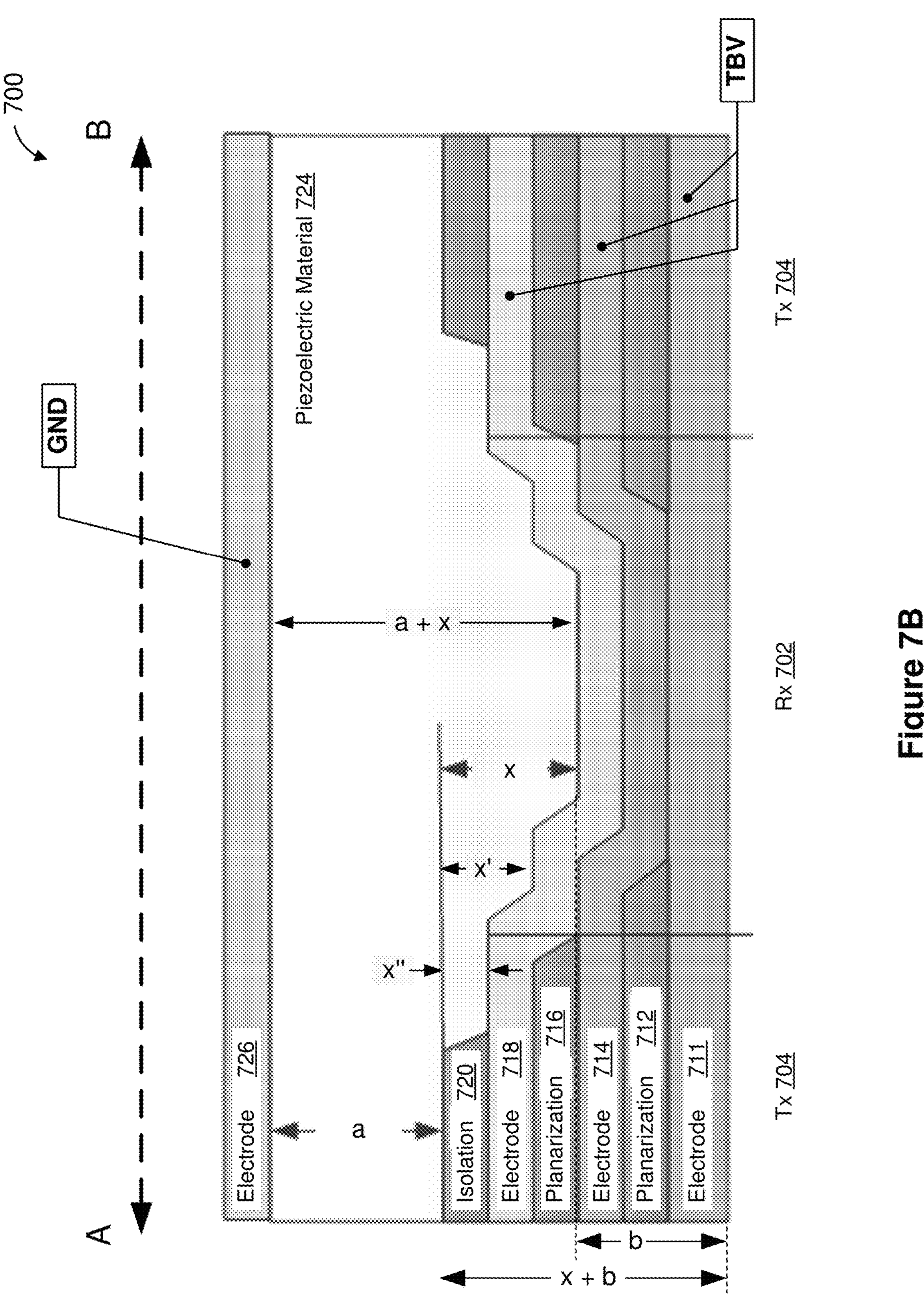

In the second configuration depicted in FIG. 7B, voltage may be applied to the first, second, and/or third electrode layers 711, 714, and/or 718, and the fourth electrode layer 726 may be grounded. Note that since electrode layers 711, 714, and 718 are connected in this configuration, applying voltage to any of these electrode layers or portion thereof may result in application of voltage to all layers. In some implementations, the voltage applied to the first, second, and third electrode layers 711, 714, and 718 may be TBV. In some examples, a tone burst generated and emitted based on the TBV may last up to one microsecond.

Reception of acoustic signals may be performed in a third configuration (or a third mode). In the third configuration depicted in FIG. 7C, no voltage needs to be applied. In some implementations, the fourth electrode layer 726 may be grounded, and the first, second, and third electrode layers 711, 714, and 718 may be open. More specifically, in some implementations, acoustic (e.g., ultrasonic) signals may be received at the open first, second, and third electrode layers 711, 714, and 718 corresponding to the receiver elements 702. In some cases, the electrode layers may possess parasitic impedance.

Figure 7C:
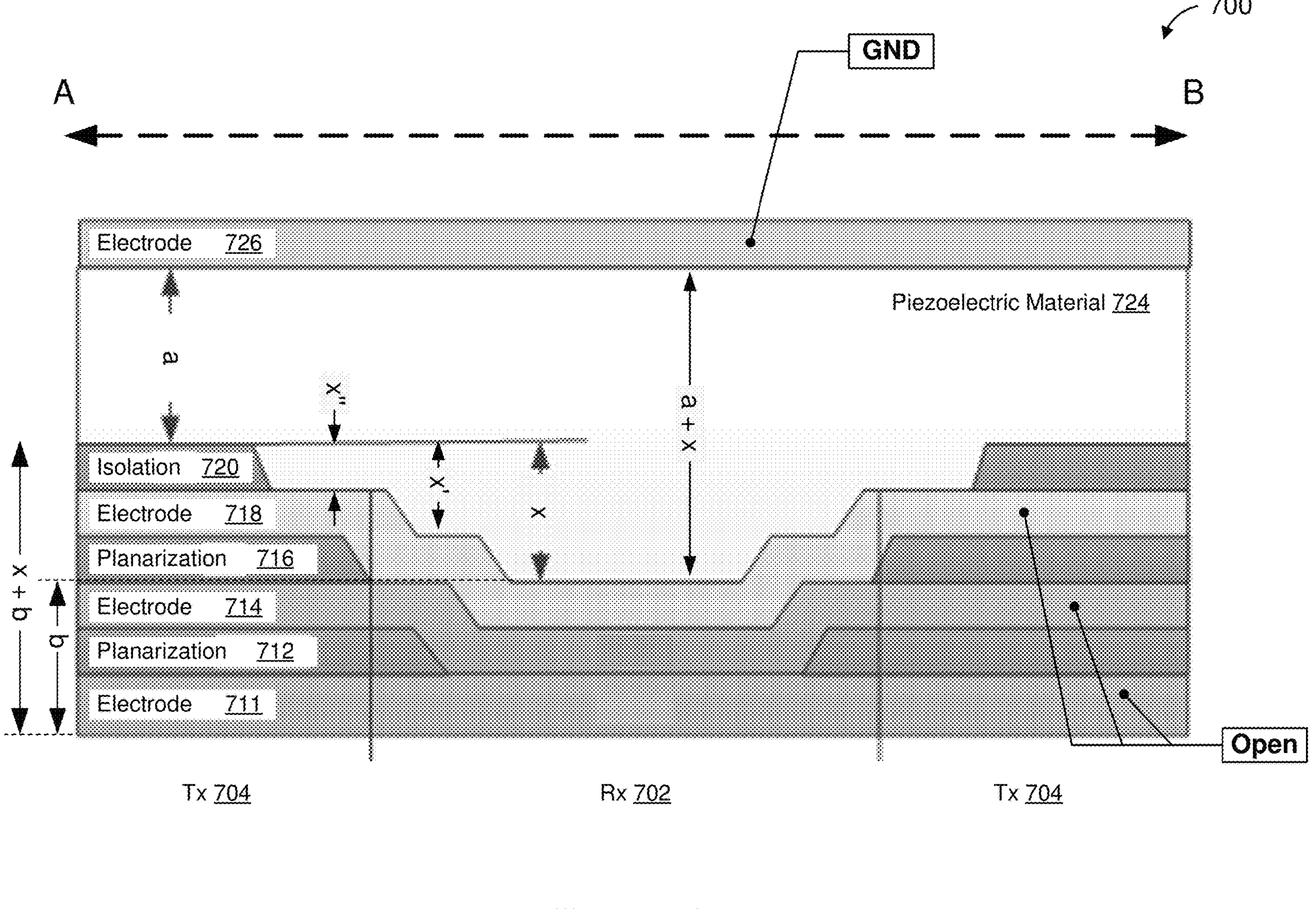

In some implementations, each of the first, second, and third configurations or modes depicted in FIGS. 7A-7C may apply to the example array 700. Hence, in a signal transmitting mode, one of two configurations (such as the first or second configuration) may be implemented with the example array 700 of a sensor apparatus. In a signal receiving mode, one configuration such as the third configuration may be implemented with the example array 700 of the sensor apparatus. However, in some implementations, these three configurations or modes may apply to other stacks of material and arrangements of layers.

Figures 8, 9:
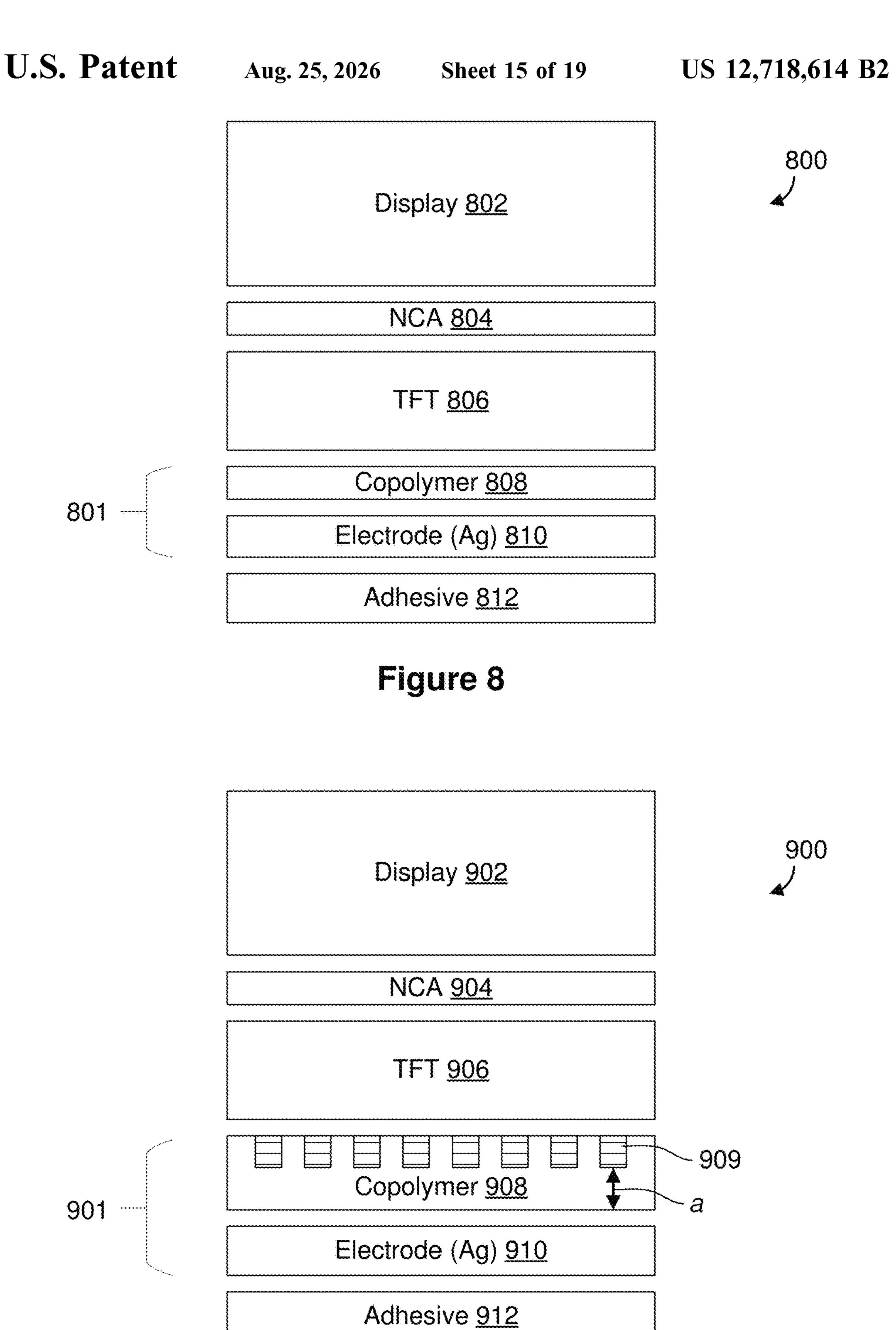
FIG. 8 shows a cross-sectional diagram of an example stack of materials usable with a device.
FIG. 9 shows a cross-sectional diagram of an example array of materials usable with a device, according to some embodiments.

These example arrays 500 and 700 may be implemented in sensor apparatus within a larger device that uses a display. Such a display may use the sensor apparatus for, in some cases, fingerprint sensing. FIGS. 8 and 9 discuss stacks of materials that may be usable by such devices.

FIG. 8 shows a cross-sectional diagram of an example stack of materials 800 usable with a device. A sensor apparatus 801 may be implemented with the device. The sensor apparatus 801 may include copolymer layer 808, which may be part of a piezoelectric layer. An electrode 810 may be disposed adjacent to the copolymer layer 808. In some cases, the electrode 810 may include a silver (Ag) layer. In some cases, the sensor apparatus 801 (e.g., at the electrode 810) may be adhered to the device via an adhesive 812. The adhesive 812 may be a film adhesive usable with circuit boards and/or other electronic components or structure (not shown).

On the other side of the example stack of materials 800, a TFT layer 806 including transistors (e.g., thin-film transistors deposited by film deposition) and/or other electronic components may be disposed adjacent to the copolymer layer 808. A negative control area (NCA) 804 may be disposed between a display 802 and the TFT layer 806, under at least some portions across the display 802. An NCA may refer to a region of a display that is intentionally left inactive or unresponsive to touch input. NCA 804 may be made of insulating material, such as a dielectric material or a polymer, that are not touch sensitive. An NCA can prevent unintended interactions and enhance the user experience by ensuring that certain areas of the screen do not respond to touch commands, and may be placed near edges, corners, and/or buttons (or another user-interactive element). As such, an NCA may be useful especially with devices with minimal bezels or edge-to-edge screens, or flexible (e.g., foldable) devices with which unintended contact with the display 802 may be more likely than flat-panel displays.

FIG. 9 shows a cross-sectional diagram of an example array of materials 900 usable with a device, according to some embodiments. A sensor apparatus 901 may be implemented with the device. The sensor apparatus 901 may be an example of sensor apparatus 300.

In some embodiments, the sensor apparatus 901 may include copolymer layer 908, which may be part of a piezoelectric layer (e.g., piezoelectric material 524 or 724). As discussed above with respect to example arrays 500 and 700 of FIGS. 5 and 7, the copolymer layer 908 may fill in space created by raised portions 909 corresponding to, for example, transmitter elements (e.g., transmitter elements 504 or 704) in some implementations. That is to say, the distance between the top surface of the raised portions 909 and the surface of the copolymer layer 908 may be distance labeled a as shown in and discussed with respect to FIGS. 5 and 7. As mentioned above, in other implementations, raised portions 909 may correspond to receiver elements (e.g., receiver elements 502 or 702).

In some embodiments, an electrode 910 may be disposed adjacent to the copolymer layer 908. In some cases, the electrode 910 may include a silver (Ag) layer, and may be an example of the third electrode layer 526 or the fourth electrode layer 726. In some cases, the sensor apparatus 901 (e.g., at the electrode 910) may be adhered to the device via an adhesive 912. The adhesive 912 may be a film adhesive usable with circuit boards and/or other electronic components or structure (not shown).

As alluded to above, different configurations of voltages applied or not applied may be set depending on whether the raised portions 909 are receiving acoustic (e.g., ultrasonic) signals or not, and whether the non-raised portions between the raised portions 909 are transmitting acoustic (e.g., ultrasonic) signals or not.

On the other side of the example stack of materials 900 may include a display 902, an NCA layer 904, and a TFT layer 906 disposed adjacent to one another and the copolymer layer 908. In some implementations, display 902 may be an example of display 802. In some implementations, display 902 may be a plastic organic light-emitting diode (pOLED) display, a foldable display, a rollable display, or a micro-LCD display. NCA layer 904 may be an example of NCA 804. TFT layer 906 may be an example of TFT layer 806.

As can be seen, there are differences between example stacks of materials 800 and 900. Namely, example stack of materials 900 (and in particular the sensor apparatus 901) may include independent pixels of transmitting elements and receiving elements that are formed and placed at different, controllable heights relative to each other. The transmitting elements and receiving elements may respectively emit and receive acoustic (e.g., ultrasonic) signals In some embodiments, such as that shown in FIG. 5, there may be an electrical separation (e.g., 522) or gap between the transmitter elements and the receiver elements. Aforementioned advantages, such as increased design options in certain display devices, can be obtained via these distinguishing features.

As mentioned above, there may be a tradeoff in performances of transmitting elements and receiving elements when different heights are employed. In alternative embodiments, further tradeoffs can be made based on other factors (e.g., size and/or voltage), as will discussed below using another example embodiment of an array of transmitter elements and receiver elements.

Figure 10:
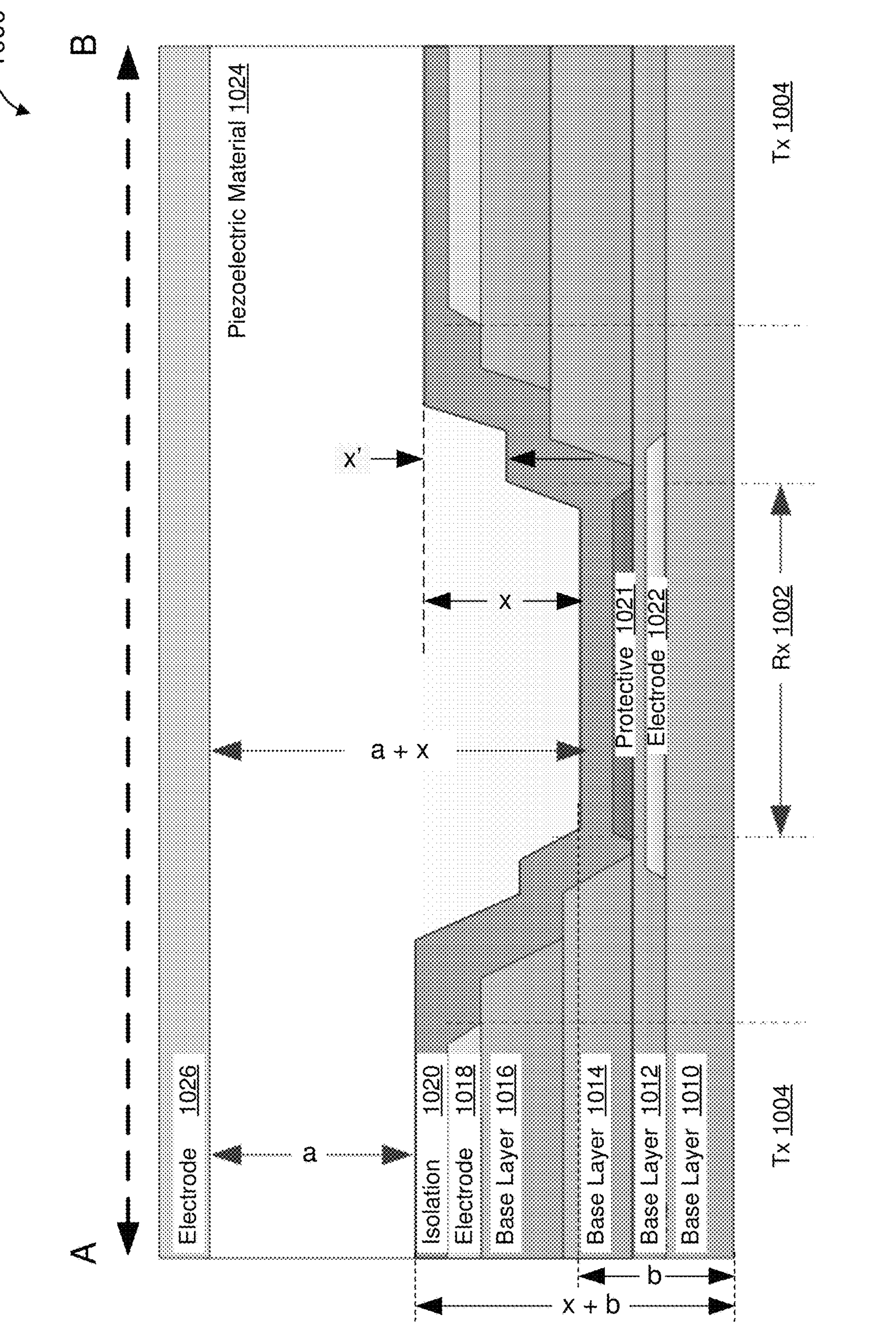
FIG. 10 shows a cross-sectional diagram of an example array of at least one transmitter element and at least one receiver element, according to some embodiments.

FIG. 10 shows a cross-sectional diagram of an example array 1000 of at least one receiver element 1002 and at least one transmitter element 1004, according to some embodiments. The sensor apparatus may be an example of sensor apparatus 300. The example array 1000 may be a portion of array 400, where the cross-sectional view shown in FIG. 10 may be taken across line A-B shown in FIG. 4.

The example array 1000 may include several layers in its stack of materials, which may vary (e.g., spatially) across portions of the example array 1000. Each of those portions of the example array 1000 may include a stack of materials that corresponds to a receiver element 1002 or a transmitter element 1004. Similar to example arrays 500 and 700, there may be fewer layers of material in the portion that corresponds to the receiver element 1002 as compared to the portions that correspond to the transmitter elements 1004. Hence, there may be a difference in thicknesses or heights associated with the receiver element(s) 1002 and the transmitter element(s) 1004, represented by distance x.

In some embodiments, piezoelectric material 1024 may have a thickness of distance a at the portion corresponding to the transmitter element 1004, which may also be equal to the distance between a surface of the isolation layer 1020 and a surface of a third electrode layer 1026. Further, the piezoelectric material 1024 may have a thickness of $\alpha$+x at least at some portion corresponding to the receiver element 1002.

In some implementations, a may have a value of up to 9 μm. x may have a value of up to 8 μm. For example, x may be equal to about 3.8 μm (where x' may be about 2.3 μm, for instance). In such an example, $\alpha$+x may be equal to about 12.8 μm. In some implementations, x may have a value of up to 25 μm. In some implementations, b may have a value of up to 8 μm. In some implementations, x+b may have a value of up to 8 μm. Heights and distances can, of course, as stated above, be adjusted to tune the desired performance of the receiver element(s) 1002 and/or the transmitter element(s) 1004.

Figures 11A, 11B:
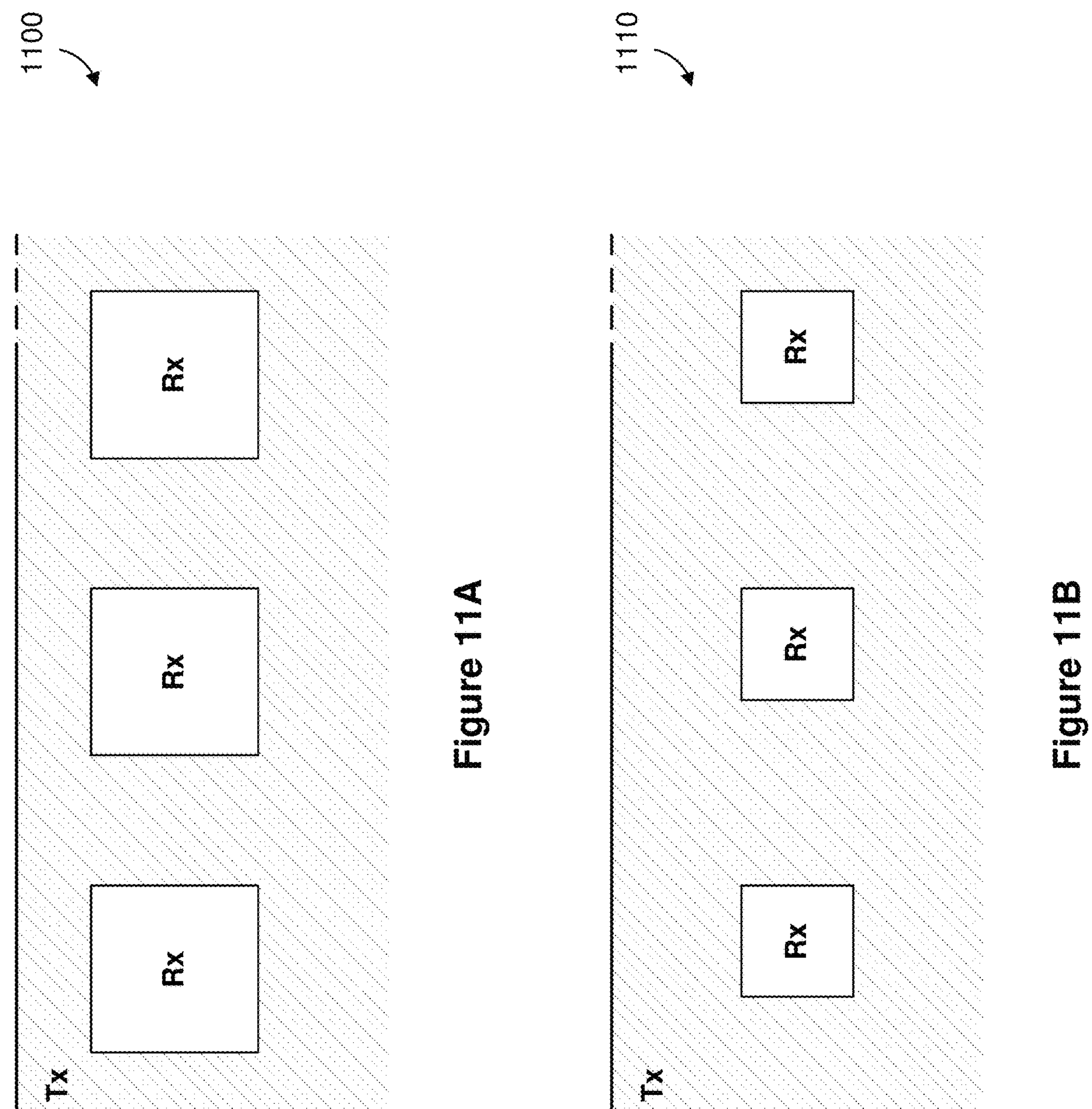
FIGS. 11A and 11B show block diagrams showing different sizes of transmitter elements and receiver elements, according to some embodiments.

In some configurations, however, the size or area of the receiver elements 1002 and/or the transmitter elements 1004 may be varied. As shown in FIGS. 11A and 11B, different sizes of receiver elements 1002 and transmitter elements 1004 may be selected and implemented in arrays of transmitter elements and receiver elements. For example, the pads or areas associated with receiver elements in example array 1100 of FIG. 11A may be larger than the pads in example array 1110 of FIG. 11B. The size of the receiver elements may bring low impact to the performance of transmitter elements in some configurations. Rather, as discussed with respect to graph 600 of FIG. 6, the heights of the transmitter and receiver elements may have a greater impact on relative performance. Similarly, the pads or areas associated with the transmitter elements in example array 1110 of FIG. 11B may be larger than those of the receiver elements.

However, there may be other types of tradeoffs in selecting the size of the transmitter and receiver elements. For example, during transmission mode when generating and transmitting acoustic (e.g., ultrasonic) signals, e.g., in tone bursts, a higher voltage may be needed to drive the transmission of the signals if using larger transmitter elements. In stacks that include sensitive components such as a TFT layer (e.g., TFT layer 806), such components may be exposed to higher voltage than may be safe. Hence, in some approaches, minimizing the size of the receiver elements in array 1110 of FIG. 11B (e.g., to save manufacturing costs of certain layers, or to emphasize transmission) may be limited according to what is an acceptable level of voltage that the transmitter elements or certain layers of the array 1110 may be exposed to.

Referring back to FIG. 10, in some embodiments, the example array 1000 may include, in some portions of the example array 1000 (e.g., corresponding to the transmitter elements 1004), a stack of materials that include a first base layer 1010, a second base layer 1012, a third base layer 1014, and/or a fourth base layer 1016. Base layers 1010-1016 may each be an example of the base layer 512, first planarization layer 712, or second planarization layer 716. For example, each of base layers 1010-1016 may include a dielectric layer or a resin. Base layers 1010-1016 may have varying heights or thickness, e.g., up to about 1000 Angstroms (Å) in some implementations. In some implementations, the first base layer 1010 may be constructed to electrically isolate and insulate from electrical interference with another layer or metal interconnects of a sensor apparatus or device implementing example array 1000.

Further, the stack of materials may include a first electrode layer 1018, an isolation layer 1020, a piezoelectric material 1024, and a third electrode layer 1026. In some implementations, the first electrode layer 1018 may be an example of the second electrode layer 518, and the first electrode layer 1018 may be a layer of indium tin oxide (ITO). In some implementations, the third electrode layer 1026 may be an example of the third electrode layer 526 or the fourth electrode layer 726, and the third electrode layer 1026 may include a layer of silver (Ag). In some implementations, the piezoelectric material 1024 may be an example of piezoelectric material 524 or 724.

In some portions of the example array 1000 that correspond to a receiver element 1002, a stack of materials may include the first base layer 1010, the second base layer 1012, the isolation layer 1020, the piezoelectric material 1024, and the third electrode layer 1026.

In some implementations, a portion of the second (or another) base layer 1012 corresponding to the receiver element 1002 may include a second electrode layer 1022. In some implementations, the second electrode layer 1022 may be an example of the first electrode layer 711, and may include a metal layer.

In some implementations, a portion of the isolation layer 1020 corresponding to the receiver element 1002 may include a protective layer 1021. In some implementations, the protective layer 1021 may include a transparent protective material (TPM). This material may be constructed to protect sensitive layers of a display, such as the underlying circuitry or the touch-sensitive surface of a sensor apparatus or a display, while still allowing optical and acoustic signals to pass through without significant distortion. Examples of this material may include glass, polymer, or a coating of film (including an anti-reflective film).

In some embodiments, there may be one receiver element 1002 entrenched between two transmitter elements 1004, as shown in FIG. 10. In other words, there may be one receiver element 1002 for every two transmitter elements 1004. In other embodiments, however, an array of transmitter elements and receiver elements may have one transmitter element entrenched between two receiver elements, as will be discussed below. That is, there may be one transmitter element 1004 for every two receiver elements 1002 in such embodiments.

In example array 1000, an electrical separation using a physical notch (such as physical notch 523) may not be present, similar to the embodiment of example array 700. However, the receiver element 1002 and the transmitter elements 1004 may still operate independently to generate and emit acoustic (e.g., ultrasonic) signals, and receive and detect returning acoustic (e.g., ultrasonic) signals, respectively, by virtue of applying voltage to the receiver element 1002 and/or the transmitter elements 1004 (more specifically, the electrodes therein). In some implementations, however, a physical notch may be present to create an electrical separation between the receiver element 1002 and the transmitter element 1004.

In some embodiments, the layers discussed herein may be arranged according to what is shown in FIG. 10. However, in some other embodiments, there may be fewer layers as shown in FIG. 10. In some other embodiments, there may be multiple instances of a given layer, whether disposed adjacent to one another or disposed elsewhere within the stack.

Implementation Examples

Embodiments of the sensor apparatus and systems described above may be implemented and operated in different ways.

In some example implementations, one or more acoustic (e.g., ultrasonic) signals may be emitted from one or more transmitter elements of a sensor system (e.g., from acoustic transmission system 302 of sensor apparatus 300), and one or more acoustic (e.g., ultrasonic) signals may be received at one or more receiver elements of the sensor system (e.g., at acoustic receiver system 304 of sensor apparatus 300). Such acoustic (e.g., ultrasonic) signals may include fingerprint data. Fingerprint data may include, for instance, distance information associated with ridges and valleys of a finger, a two- or three-dimensional image of the fingerprint (which may be constructed from respective distance information from the array of transmitter elements and receiver elements, or optically), features extracted from an image, finger vein patterns, and/or subdermal or dermis structures.

Further, in some cases, a user device communicatively coupled with the sensor system may perform an operation based on the received one or more acoustic (e.g., ultrasonic) signals. Examples of the operation may include identifying an object (such as a finger or fingerprint), changing an operative state of the device and/or activate other functions of the device (unlock or lock the device, initialize an application, authenticate a user, etc.). In some approaches, the received one or more acoustic (e.g., ultrasonic) signals may meet at least one criterion to cause the user device to perform the operation. An example of the criterion may be a fingerprint match of the fingerprint data, e.g., received fingerprint data matching stored fingerprint data.

In some example implementations, during a transmitting mode, the sensor system may apply voltage to one or more electrode layers of a transmitter element, ground one or more electrode layers of the transmitter element, and/or keep open one or more electrode layers; and during a receiving mode, the sensor system may ground one or more electrode layers and keep open one or more electrode layers of the receiver element. Sec, for example, the configurations and approaches described with respect to FIGS. 5A-5C and 7A-7C. A first stack of materials having the plurality of electrode layers of the transmitter element of the sensor system may be formed, where the first stack of materials has a first height. A second stack of materials having the plurality of electrode layers of the receiver element of the sensor system may be formed, where the second stack of materials has a second height different from the first height.

In some example implementations, a time delay may be added to different pixels (e.g., transmitter and/or receiver elements) to induce a lens effect. That is, by adding a time delay to certain pixels, acoustic (e.g., ultrasonic) waves may focus at certain points of convergence where there is constructive interference of the waves. In this way, a stronger acoustic signal may be transmitted, which may be advantageous in implementations where the performance (e.g., figure of merit) of the transmitter elements is relatively lower than that of the receiver elements.

In some approaches, a time delay may be applied to a first set of transmitter elements; and emission of a first set of ultrasound waves may be caused from a first set of transmitter elements subsequent to emission of a second set of ultrasound waves from a second set of transmitter elements based on the time delay, such that at least a portion of the first set of ultrasound waves constructively interfere with at least a portion of the second set of ultrasound waves.

In some example implementations, some returning acoustic (e.g., ultrasonic) signals may be separated, filtered out, removed, or otherwise disregarded based on a phase difference. Such filtering out may be useful for anti-spoofing purposes, where, e.g., a real finger may be differentiated from a spoofed object.

In some approaches, one or more phases associated with received one or more acoustic (e.g., ultrasound) waves may be determined; and responsive to the one or more phases having a phase difference exceeding a threshold, a spoofing of the body part of the user may be identified.

Example Methods

Figure 12:
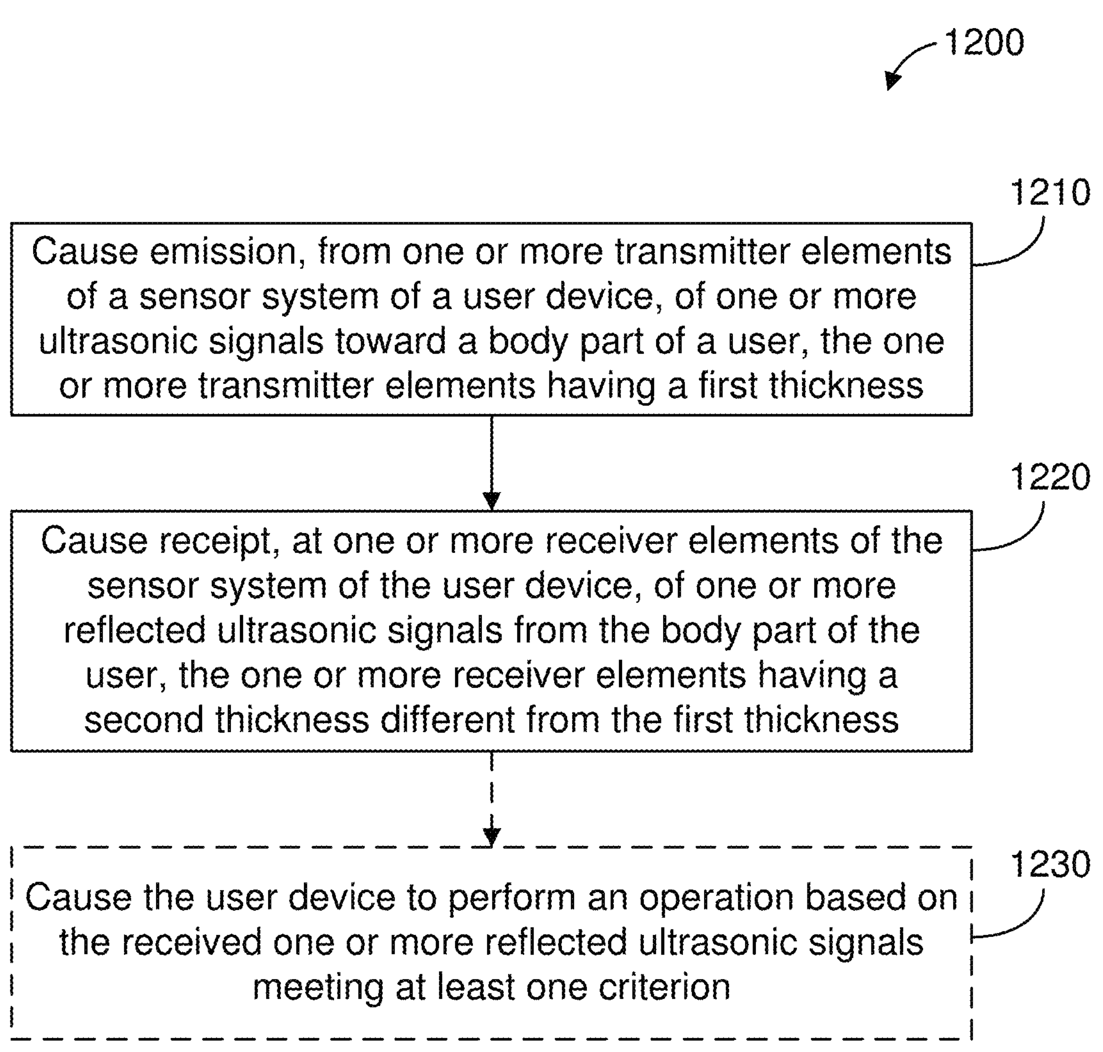
FIG. 12 is a flow diagram of a method of operating a sensor system of a user device, according to some disclosed implementations.

FIG. 12 is a flow diagram of a method 1200 of operating a sensor system of a user device, according to some disclosed embodiments. Structure for performing the functionality illustrated in one or more of the blocks shown in FIG. 12 may be performed by hardware and/or software components of a computerized apparatus or system (which may be implemented as a wearable device in some embodiments). Components of such apparatus or system may include, for example, an acoustic transmission system, an acoustic receiver system, a control system (including one or more processors), a memory, and/or a computer-readable apparatus including a storage medium storing computer-readable and/or computer-executable instructions that are configured to, when executed by the control system, cause the control system, the one or more processors, or the apparatus or system to perform operations represented by blocks below. Example components of the apparatus or system are illustrated in, e.g., FIGS. 3-10, which are described in more detail above.

The blocks of FIG. 12 may, for example, be performed by the apparatus 300 or by a similar apparatus, or a component thereof (e.g., a control system). As with other methods disclosed herein, the method outlined in FIG. 12 may include more or fewer blocks than indicated. Moreover, the blocks of methods disclosed herein are not necessarily performed in the order indicated. In some instances, one or more of the blocks shown in FIG. 12 may be performed concurrently.

At block 1210, the method 1200 may include causing (e.g., by a control system, such as control system 306) emission, from one or more transmitter elements of a sensor system of the user device, of one or more ultrasonic signals toward a body part of a user, the one or more transmitter elements having a first thickness.

Means for performing functionality at block 1210 may include the acoustic transmission system 302, the control system 306, and/or other components of the apparatus as shown in FIG. 3.

At block 1220, the method 1200 may include causing (e.g., by a control system, such as control system 306) receipt, at one or more receiver elements of the sensor system of the user device, of one or more reflected ultrasonic signals from the body part of the user, the one or more receiver elements having a second thickness different from the first thickness.

In some embodiments, the one or more transmitter elements may include: a first electrode layer (e.g., first electrode layer 514); a first planarization layer disposed on the first electrode layer (e.g., planarization layer 516); a first portion of a second electrode layer disposed on the first planarization layer (e.g., second electrode layer 518); a first portion of an isolation layer disposed on the first portion of the second electrode layer (e.g., isolation layer 520); and a first portion of a piezoelectric material disposed on the first portion of the isolation layer (e.g., piezoelectric material 524).

Further, the one or more receiver elements may include: a second portion of the second electrode layer (e.g., second electrode layer 518); a second portion of the isolation layer disposed on the second portion of the second electrode layer (e.g., isolation layer 520); and a second portion of the piezoelectric material disposed on the second portion of the isolation layer (e.g., piezoelectric material 524).

In some embodiments, the first portion of the piezoelectric material of the one or more transmitter elements may have a first thickness (e.g., distance a shown in FIG. 5), and the second portion of the piezoelectric material of the one or more receiver elements may have a second thickness different from the first thickness (e.g., distance $\alpha$+x shown in FIG. 5). In some implementations, the first thickness of the first portion of the piezoelectric material of the acoustic transmitter element may be smaller than the second thickness of the second portion of the piezoelectric material of the acoustic receiver element. In some implementations, the first thickness of the first portion of the piezoelectric material of the acoustic transmitter element may be larger than the second thickness of the second portion of the piezoelectric material of the acoustic receiver element.

In some embodiments, the encapsulation layer may be structured to create a gap (e.g., electrical separation 522) that physically separates the first portion of the second electrode layer from the second portion of the second electrode layer.

In some embodiments, the sensor system may include an array of acoustic receiver elements disposed adjacent to respective ones of an array of acoustic transmitter elements; the array of acoustic receiver elements may include the one or more receiver elements; and the array of acoustic transmitter elements may include the one or more transmitter elements.

In some implementations, the array of acoustic transmitter elements may be configured to emit one or more ultrasound waves; and the array of acoustic receiver elements may be configured to receive one or more ultrasound waves.

In some scenarios, the one or more ultrasound waves received by the array of acoustic receiver elements may include one or more ultrasound waves reflected from a body part of a user; and a control system may be configured to cause the user device communicatively coupled with the sensor system to perform an operation based on the received one or more ultrasound waves meeting at least one criterion. In some examples, the body part of the user may include a finger, and the at least one criterion may include a fingerprint match.

In some implementations, the control system may be further configured to: determine one or more phases associated with the received one or more ultrasound waves; and responsive to the one or more phases having a phase difference exceeding a threshold, identify a spoofing of the body part of the user.

In some implementations, the array of acoustic transmitter elements may include a first set of acoustic transmitter elements and a second set of acoustic transmitter elements; and the control system may be configured to: apply a time delay to the first set of acoustic transmitter elements; and cause emission of a first set of ultrasound waves from the first set of acoustic transmitter elements subsequent to emission of a second set of ultrasound waves from the second set of acoustic transmitter elements based on the time delay, such that at least a portion of the first set of ultrasound waves constructively interfere with at least a portion of the second set of ultrasound waves.

In some embodiments, the one or more transmitter elements may further include a base layer (e.g., base layer 512), the first electrode disposed on the base layer; and a third electrode layer (e.g., third electrode layer 526, or a layer that includes Ag) may be disposed on the first portion and the second portion of the piezoelectric material.

In some implementations, the control system may be configured to cause emission of an ultrasound wave from the one or more transmitter elements by applying a tone burst voltage to the third electrode layer. In some configurations, during the emission of the ultrasound wave: the second portion of the second electrode layer of the one or more receiver elements may be open through a parasitic circuit element; and the first portion of the second electrode layer of the one or more transmitter elements may be grounded. In some implementations, the control system may be configured to cause emission of an ultrasound wave from the one or more transmitter elements by applying a tone burst voltage to the second portion of the first electrode layer of the acoustic transmitter element. In some configurations, during the emission of the ultrasound wave: the second portion of the second electrode layer of the one or more receiver elements may be open; and the third electrode layer may be grounded. See, for example, FIGS. 5A and 5B.

In some implementations, the control system may be configured to cause receipt of an ultrasound wave via the acoustic receiver element. In some configurations, during the receipt of the ultrasound wave: the third electrode layer may be grounded; the first portion of the second electrode layer of the one or more transmitter elements may be grounded; and the second portion of the second electrode layer of the acoustic receiver element may be open through one or more parasitic circuit elements.

In some embodiments, an area associated with the one or more receiver elements may be larger than an area associated with the one or more transmitter elements. In some embodiments, an area associated with the one or more transmitter elements may be larger than an area associated with the one or more receiver elements. In some implementations, the width of a receiver element may be up to 200 microns.

Means for performing functionality at block 1220 may include the acoustic receiver system 304, the control system 306, and/or other components of the apparatus as shown in FIG. 3.

Optionally, at block 1230, the method 1200 may include causing the user device to perform an operation based on the received one or more reflected ultrasonic signals meeting at least one criterion. The user device may be communicatively coupled with the sensor system. In some examples, the operation may include identifying an object (such as a finger or fingerprint), changing an operative state of the device and/or activate other functions of the device (unlock or lock the device, initialize an application, authenticate a user, etc.). An example of the criterion may be a fingerprint match of the fingerprint data, e.g., received fingerprint data matching stored fingerprint data.

Means for performing functionality at block 1230 may include the control system 306 and/or other components of the apparatus as shown in FIG. 3.

Figure 13:
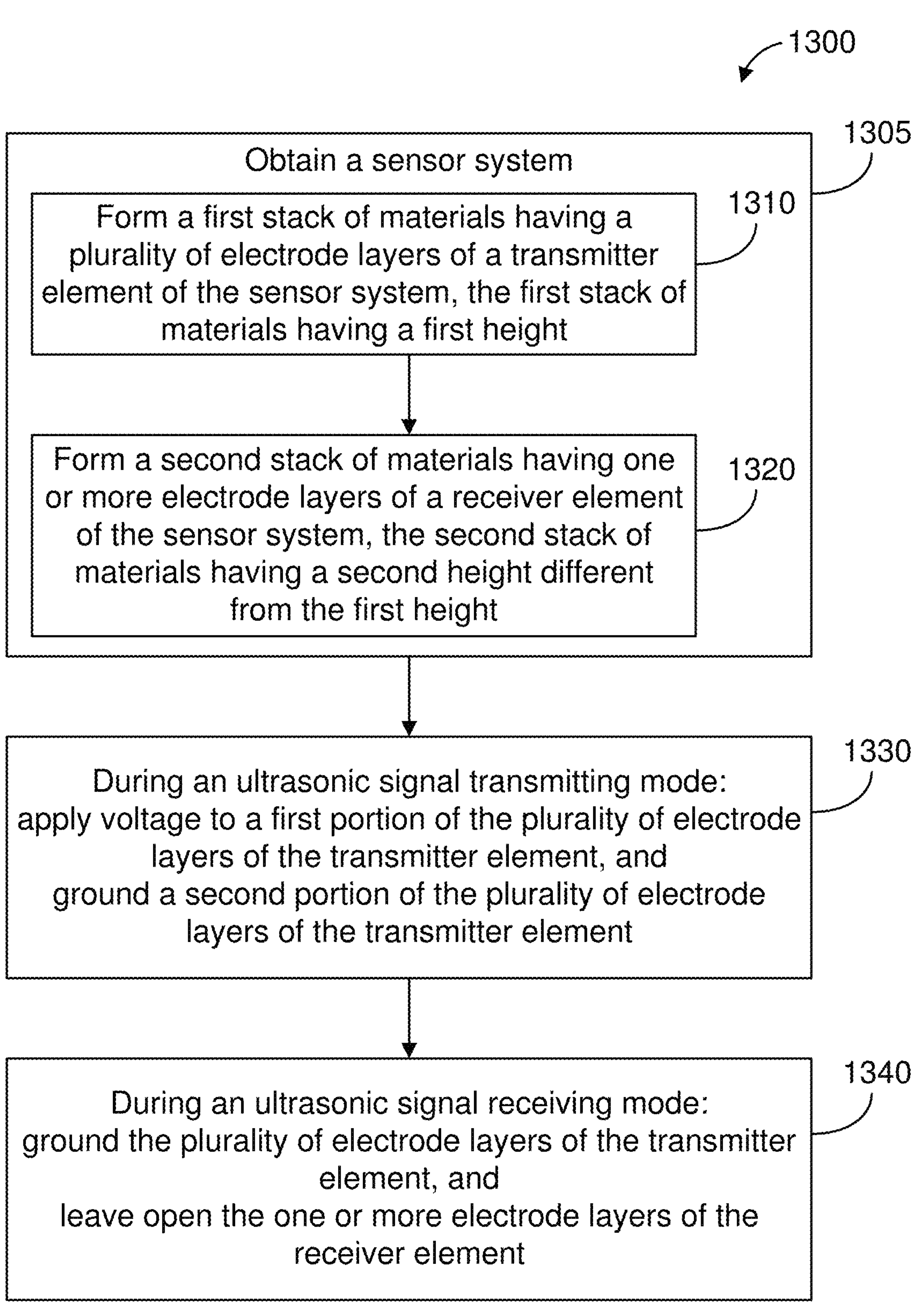
FIG. 13 is a flow diagram of a method of configuring a sensor system of a user device, according to some disclosed implementations.

FIG. 13 is a flow diagram of a method 1300 of operating a sensor system of a user device, according to some disclosed embodiments. Structure for performing the functionality illustrated in one or more of the blocks shown in FIG. 13 may be performed by hardware and/or software components of a computerized apparatus or system (which may be implemented as a wearable device in some embodiments). Components of such apparatus or system may include, for example, an acoustic transmission system, an acoustic receiver system, a control system (including one or more processors), a memory, and/or a computer-readable apparatus including a storage medium storing computer-readable and/or computer-executable instructions that are configured to, when executed by the control system, cause the control system, the one or more processors, or the apparatus or system to perform operations represented by blocks below. Example components of the apparatus or system are illustrated in, e.g., FIGS. 3-10, which are described in more detail above.

The blocks of FIG. 13 may, for example, be performed by the apparatus 300 or by a similar apparatus, or a component thereof (e.g., a control system). As with other methods disclosed herein, the method outlined in FIG. 13 may include more or fewer blocks than indicated. Moreover, the blocks of methods disclosed herein are not necessarily performed in the order indicated. In some instances, one or more of the blocks shown in FIG. 13 may be performed concurrently.

At block 1305, the method 1300 may include obtaining the sensor system. In some approaches, obtaining the sensor system may include, at block 1310, forming a first stack of materials having a plurality of electrode layers of a transmitter element of the sensor system, the first stack of materials having a first height; and, at block 1320, forming a second stack of materials having one or more electrode layers of a receiver element of the sensor system, the second stack of materials having a second height different from the first height. See, for example, the embodiments shown in FIGS. 5, 7, and 10.

At block 1330, the method 1300 may include, during an ultrasonic signal transmitting mode: applying voltage to a first portion of the plurality of electrode layers of the transmitter element, and grounding a second portion of the plurality of electrode layers of the transmitter element. See, for example, the configurations described with respect to FIGS. 5A-5C. In one illustrative example, according to FIG. 5A, TBV may be applied to third electrode layer 526, and second electrode layer 518 corresponding to the transmitter element may be grounded. In another illustrative example, according to FIG. 5B, TBV may be applied to the second electrode layer 518 corresponding to the transmitter element, and third electrode layer 526 may be grounded.

In some implementations, second electrode layer 518 corresponding to receiver element 502 may be left open during the ultrasonic transmitting mode.

Means for performing functionality at block 1330 may include the control system 306 and/or other components of the apparatus as shown in FIG. 3.

At block 1340, the method 1300 may include, during an ultrasonic signal receiving mode, grounding the plurality of electrode layers of the transmitter element, and leaving open the one or more electrode layers of the receiver element. In one illustrative example, according to FIG. 5C, the third electrode layer 526 and the second electrode layer 518 corresponding to the transmitter element may be grounded, while the second electrode layer 518 corresponding to the receiver element may be left open.

Means for performing functionality at block 1340 may include the control system 306 and/or other components of the apparatus as shown in FIG. 3.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance, or illustration." Any implementation described herein as "exemplary" is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

Various modifications to the implementations described in this disclosure may be readily apparent to those skilled in the art, and the generic principles defined herein may be applied to other implementations without departing from the spirit or scope of this disclosure. Thus, the following claims are not intended to be limited to the implementations shown herein, but are to be accorded the widest scope consistent with this disclosure, the principles and the novel features disclosed herein.

Additionally, certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. Moreover, various ones of the described and illustrated operations can itself include and collectively refer to a number of sub-operations. For example, each of the operations described above can itself involve the execution of a process or algorithm. Furthermore, various ones of the described and illustrated operations can be combined or performed in parallel in some implementations. Similarly, the separation of various system components in the implementations described above should not be understood as requiring such separation in all implementations. As such, other implementations are within the scope of the following claims. In some cases, the actions recited in the claims can be performed in a different order and still achieve desirable results.

Implementation examples are described in the following numbered clauses:

Clause 1: A sensor system comprising: an acoustic receiver element comprising: a first electrode layer; a first planarization layer disposed on the first electrode layer; a first portion of a second electrode layer disposed on the first planarization layer; a first portion of an isolation layer disposed on the first portion of the second electrode layer; and a first portion of a piezoelectric material disposed on the first portion of the isolation layer; and an acoustic transmitter element comprising: a second portion of the second electrode layer; a second portion of the isolation layer disposed on the second portion of the second electrode layer; and a second portion of the piezoelectric material disposed on the second portion of the isolation layer; wherein the first portion of the piezoelectric material of the acoustic receiver element comprises a first thickness, and the second portion of the piezoelectric material of the acoustic transmitter element comprises a second thickness different from the first thickness; and wherein the isolation layer is structured to create a gap that physically separates the first portion of the second electrode layer from the second portion of the second electrode layer.

Clause 2: The sensor system of clause 1, wherein: the sensor system further comprises an array of acoustic receiver elements disposed adjacent to respective ones of an array of acoustic transmitter elements; the array of acoustic receiver elements comprises the acoustic receiver element; and the array of acoustic transmitter elements comprises the acoustic transmitter element.

Clause 3: The sensor system of clause 2, wherein: the array of acoustic transmitter elements is configured to emit one or more ultrasound waves; and the array of acoustic receiver elements is configured to receive one or more ultrasound waves.

Clause 4: The sensor system of clause 3, wherein: the one or more ultrasound waves received by the array of acoustic receiver elements comprise one or more ultrasound waves reflected from a body part of a user; and a control system is configured to cause a user device communicatively coupled with the sensor system to perform an operation based on the received one or more ultrasound waves meeting at least one criterion.

Clause 5: The sensor system of clause 4, wherein the body part of the user comprises a finger, and the at least one criterion comprises a fingerprint match.

Clause 6: The sensor system of clause 4, wherein the control system is further configured to: determine one or more phases associated with the received one or more ultrasound waves; and responsive to the one or more phases having a phase difference exceeding a threshold, identify a spoofing of the body part of the user.

Clause 7: The sensor system of clause 2, wherein: the array of acoustic transmitter elements comprises a first set of acoustic transmitter elements and a second set of acoustic transmitter elements; and a control system is configured to: apply a time delay to the first set of acoustic transmitter elements; and cause emission of a first set of ultrasound waves from the first set of acoustic transmitter elements subsequent to emission of a second set of ultrasound waves from the second set of acoustic transmitter elements based on the time delay, such that at least a portion of the first set of ultrasound waves constructively interfere with at least a portion of the second set of ultrasound waves.

Clause 8: The sensor system of clause 1, wherein: the acoustic receiver element further comprises a base layer, the first electrode disposed on the base layer; and a third electrode layer is disposed on the first portion and the second portion of the piezoelectric material.

Clause 9: The sensor system of clause 8, further comprising a control system configured to cause emission of an ultrasound wave from the acoustic transmitter element by applying a tone burst voltage to the third electrode layer; wherein, during the emission of the ultrasound wave: the first portion of the second electrode layer of the acoustic receiver element is open through one or more parasitic circuit elements; and the second portion of the second electrode layer of the acoustic transmitter element is grounded.

Clause 10: The sensor system of clause 8, further comprising a control system configured to cause emission of an ultrasound wave from the acoustic transmitter element by applying a tone burst voltage to the second portion of the second electrode layer of the acoustic transmitter element; wherein, during the emission of the ultrasound wave: the first portion of the second electrode layer of the acoustic receiver element is open through one or more parasitic circuit elements; and the third electrode layer is grounded.

Clause 11: The sensor system of clause 8, wherein, further comprising a control system configured to cause receipt of an ultrasound wave via the acoustic receiver element; wherein, during the receipt of the ultrasound wave: the third electrode layer is grounded; the first portion of the second electrode layer of the acoustic receiver element is open through one or more parasitic circuit elements; and the second portion of the second electrode layer of the acoustic transmitter element is grounded.

Clause 12: The sensor system of clause 1, wherein the first thickness of the first portion of the piezoelectric material of the acoustic receiver element is smaller than the second thickness of the second portion of the piezoelectric material of the acoustic transmitter element.

Clause 13: The sensor system of clause 1, wherein the first thickness of the first portion of the piezoelectric material of the acoustic receiver element is larger than the second thickness of the second portion of the piezoelectric material of the acoustic transmitter element.

Clause 14: The sensor system of clause 1, wherein an area associated with the acoustic receiver element is larger than an area associated with the acoustic transmitter element.

Clause 15: The sensor system of clause 1, wherein an area associated with the acoustic transmitter element is larger than an area associated with the acoustic receiver element.

Clause 16: A sensor system comprising: an acoustic receiver element comprising: a first portion of a first electrode layer; a first planarization layer disposed on the first portion of the first electrode layer; a first portion of a second electrode layer disposed on the first planarization layer; an isolation layer disposed on the first portion of the second electrode layer; and a first portion of a piezoelectric material disposed at least on the isolation layer; and an acoustic transmitter element comprising: a second portion of the first electrode layer; a second portion of the second electrode layer disposed on the second portion of the first electrode layer; and a second portion of the piezoelectric material disposed on the second portion of the second electrode layer; wherein the first portion of the piezoelectric material of the acoustic receiver element comprises a first thickness, and the second portion of the piezoelectric material of the acoustic transmitter element comprises a second thickness different from the first thickness.

Clause 17: The sensor system of clause 16, wherein: the acoustic transmitter element is configured to emit one or more ultrasound waves; the acoustic receiver element is configured to receive one or more ultrasound waves reflected from a body part of a user; a control system is configured to cause a user device communicatively coupled with the sensor system to perform an operation based on the received one or more ultrasound waves.

Clause 18: The sensor system of clause 17, wherein the control system is further configured to: determine one or more phases associated with the received one or more ultrasound waves; and responsive to the one or more phases having a phase difference exceeding a threshold, identify a spoofing of the body part of the user.

Clause 19: The sensor system of clause 16, wherein the sensor system further comprises an array of acoustic transmitter elements, the an array of acoustic transmitter elements comprising the acoustic transmitter element; and a control system is configured to: apply a time delay to the first set of acoustic transmitter elements; and cause emission of a first set of ultrasound waves from the first set of acoustic transmitter elements subsequent to emission of a second set of ultrasound waves from the second set of acoustic transmitter elements based on the time delay, such that at least a portion of the first set of ultrasound waves constructively interfere with at least a portion of the second set of ultrasound waves.

Clause 20: An apparatus comprising: an acoustic receiver element comprising:

a first electrode layer; a first portion of a second electrode layer; a first portion of an isolation layer disposed on the first portion of the second electrode layer; and a first portion of a piezoelectric material disposed on the first portion of the isolation layer; and an acoustic transmitter element comprising: a second portion of the second electrode layer; a second portion of the isolation layer disposed on the second portion of the second electrode layer; and a second portion of the piezoelectric material disposed on the second portion of the isolation layer; wherein the first portion of the piezoelectric material of the acoustic receiver element comprises a first thickness, and the second portion of the piezoelectric material of the acoustic transmitter element comprises a second thickness different from the first thickness; and wherein the isolation layer is structured to create a gap that physically separates the first portion of the second electrode layer from the second portion of the second electrode layer.

What is claimed:

1. A sensor system comprising:

an acoustic receiver element comprising:

a first electrode layer;

a first planarization layer disposed on the first electrode layer;

a first portion of a second electrode layer disposed on the first planarization layer;

a first portion of an isolation layer disposed on the first portion of the second electrode layer; and a first portion of a piezoelectric material disposed on the first portion of the isolation layer; and an acoustic transmitter element comprising:

a second portion of the second electrode layer;

a second portion of the isolation layer disposed on the second portion of the second electrode layer; and a second portion of the piezoelectric material disposed on the second portion of the isolation layer;

wherein the first portion of the piezoelectric material of the acoustic receiver element comprises a first thickness, and the second portion of the piezoelectric material of the acoustic transmitter element comprises a second thickness different from the first thickness;

wherein an area associated with the acoustic transmitter element is larger than an area associated with the acoustic receiver element; and wherein the isolation layer is structured to create a gap that physically separates the first portion of the second electrode layer from the second portion of the second electrode layer.

2. The sensor system of claim 1, wherein:

the sensor system further comprises an array of acoustic receiver elements disposed adjacent to respective ones of an array of acoustic transmitter elements;

the array of acoustic receiver elements comprises the acoustic receiver element; and the array of acoustic transmitter elements comprises the acoustic transmitter element.

3. The sensor system of claim 2, wherein:

the array of acoustic transmitter elements is configured to emit one or more ultrasound waves; and the array of acoustic receiver elements is configured to receive one or more ultrasound waves.

4. The sensor system of claim 3, wherein:

the one or more ultrasound waves received by the array of acoustic receiver elements comprise one or more ultrasound waves reflected from a body part of a user; and a control system is configured to cause a user device communicatively coupled with the sensor system to perform an operation based on the received one or more ultrasound waves meeting at least one criterion.

5. The sensor system of claim 4, wherein the body part of the user comprises a finger, and the at least one criterion comprises a fingerprint match.

6. The sensor system of claim 4, wherein the control system is further configured to:

determine one or more phases associated with the received one or more ultrasound waves; and responsive to the one or more phases having a phase difference exceeding a threshold, identify a spoofing of the body part of the user.

7. The sensor system of claim 2, wherein:

the array of acoustic transmitter elements comprises a first set of acoustic transmitter elements and a second set of acoustic transmitter elements; and a control system is configured to:

apply a time delay to the first set of acoustic transmitter elements; and cause emission of a first set of ultrasound waves from the first set of acoustic transmitter elements subsequent to emission of a second set of ultrasound waves from the second set of acoustic transmitter elements based on the time delay, such that at least a portion of the first set of ultrasound waves constructively interfere with at least a portion of the second set of ultrasound waves.

8. The sensor system of claim 1, wherein:

the acoustic receiver element further comprises a base layer, the first electrode layer disposed on the base layer; and a third electrode layer is disposed on the first portion and the second portion of the piezoelectric material.

9. The sensor system of claim 8, further comprising a control system configured to cause emission of an ultrasound wave from the acoustic transmitter element by applying a tone burst voltage to the third electrode layer;

wherein, during the emission of the ultrasound wave:

the first portion of the second electrode layer of the acoustic receiver element is open through one or more parasitic circuit elements; and the second portion of the second electrode layer of the acoustic transmitter element is grounded.

10. The sensor system of claim 8, further comprising a control system configured to cause emission of an ultrasound wave from the acoustic transmitter element by applying a tone burst voltage to the second portion of the second electrode layer of the acoustic transmitter element;

wherein, during the emission of the ultrasound wave:

the first portion of the second electrode layer of the acoustic receiver element is open through one or more parasitic circuit elements; and the third electrode layer is grounded.

11. The sensor system of claim 8, wherein, further comprising a control system configured to cause receipt of an ultrasound wave via the acoustic receiver element;

wherein, during the receipt of the ultrasound wave:

the third electrode layer is grounded;

the first portion of the second electrode layer of the acoustic receiver element is open through one or more parasitic circuit elements; and the second portion of the second electrode layer of the acoustic transmitter element is grounded.

12. The sensor system of claim 1, wherein the first thickness of the first portion of the piezoelectric material of the acoustic receiver element is smaller than the second thickness of the second portion of the piezoelectric material of the acoustic transmitter element.

13. The sensor system of claim 1, wherein the first thickness of the first portion of the piezoelectric material of the acoustic receiver element is larger than the second thickness of the second portion of the piezoelectric material of the acoustic transmitter element.

14. A sensor system comprising:

an acoustic receiver element comprising:

a first portion of a first electrode layer;

a first planarization layer disposed on the first portion of the first electrode layer;

a first portion of a second electrode layer disposed on the first planarization layer;

an isolation layer disposed on the first portion of the second electrode layer; and a first portion of a piezoelectric material disposed at least on the isolation layer; and an acoustic transmitter element comprising:

a second portion of the first electrode layer;

a second portion of the second electrode layer disposed on the second portion of the first electrode layer; and a second portion of the piezoelectric material disposed on the second portion of the second electrode layer;

wherein an area associated with the acoustic transmitter element is larger than an area associated with the acoustic receiver element;

wherein the first portion of the piezoelectric material of the acoustic receiver element comprises a first thickness; and wherein the second portion of the piezoelectric material of the acoustic transmitter element comprises a second thickness different from the first thickness.

15. The sensor system of claim 14, wherein:

the acoustic transmitter element is configured to emit one or more ultrasound waves;

the acoustic receiver element is configured to receive one or more ultrasound waves reflected from a body part of a user; and a control system is configured to cause a user device communicatively coupled with the sensor system to perform an operation based on the received one or more ultrasound waves.

16. The sensor system of claim 15, wherein the control system is further configured to:

determine one or more phases associated with the received one or more ultrasound waves; and responsive to the one or more phases having a phase difference exceeding a threshold, identify a spoofing of the body part of the user.

17. The sensor system of claim 14, wherein the sensor system further comprises an array of acoustic transmitter elements, the an array of acoustic transmitter elements comprising the acoustic transmitter element; and a control system is configured to:

apply a time delay to the first set of acoustic transmitter elements; and cause emission of a first set of ultrasound waves from the first set of acoustic transmitter elements subsequent to emission of a second set of ultrasound waves from the second set of acoustic transmitter elements based on the time delay, such that at least a portion of the first set of ultrasound waves constructively interfere with at least a portion of the second set of ultrasound waves.

18. An apparatus comprising:

an acoustic receiver element comprising:

a first electrode layer;

a first portion of a second electrode layer;

a first portion of an isolation layer disposed on the first portion of the second electrode layer; and a first portion of a piezoelectric material disposed on the first portion of the isolation layer; and an acoustic transmitter element comprising:

a second portion of the second electrode layer;

a second portion of the isolation layer disposed on the second portion of the second electrode layer; and a second portion of the piezoelectric material disposed on the second portion of the isolation layer;

wherein the first portion of the piezoelectric material of the acoustic receiver element comprises a first thickness, and the second portion of the piezoelectric material of the acoustic transmitter element comprises a second thickness different from the first thickness;

wherein an area associated with the acoustic transmitter element is larger than an area associated with the acoustic receiver element; and wherein the isolation layer is structured to create a gap that physically separates the first portion of the second electrode layer from the second portion of the second electrode layer.

* * * * *